United States Patent
Yasuda et al.

(10) Patent No.: US 10,177,347 B2
(45) Date of Patent: Jan. 8, 2019

(54) METHOD FOR MANUFACTURING DISPLAY DEVICE

(71) Applicant: Sharp Kabushiki Kaisha, Sakai, Osaka (JP)

(72) Inventors: Yuki Yasuda, Sakai (JP); Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/740,843

(22) PCT Filed: Jul. 1, 2016

(86) PCT No.: PCT/JP2016/003157
§ 371 (c)(1),
(2) Date: Dec. 29, 2017

(87) PCT Pub. No.: WO2017/002372
PCT Pub. Date: Jan. 5, 2017

(65) Prior Publication Data
US 2018/0198096 A1    Jul. 12, 2018

(30) Foreign Application Priority Data
Jul. 1, 2015 (JP) ................................. 2015-132643

(51) Int. Cl.
*H01L 51/56*    (2006.01)
*G02F 1/1339*    (2006.01)
(Continued)

(52) U.S. Cl.
CPC ............ *H01L 51/56* (2013.01); *G02F 1/1333* (2013.01); *G02F 1/1339* (2013.01);
(Continued)

(58) Field of Classification Search
CPC ....................................................... H01L 51/56
See application file for complete search history.

(56) References Cited

U.S. PATENT DOCUMENTS

| 7,009,676 B1* | 3/2006 | Kim | G02F 1/1345 |
| | | | 349/149 |
| 2001/0050747 A1* | 12/2001 | Hoshino | G02F 1/133753 |
| | | | 349/149 |

(Continued)

FOREIGN PATENT DOCUMENTS

| JP | 2009-205941 A | 9/2009 |
| JP | 2011-128481 A | 6/2011 |

(Continued)

OTHER PUBLICATIONS

Official Communication issued in International Patent Application No. PCT/JP20161003157, dated Sep. 27, 2016.

*Primary Examiner* — Errol Fernandes
(74) *Attorney, Agent, or Firm* — Keating & Bennett, LLP

(57) ABSTRACT

In a substrate bonding step of bonding an element original substrate to a counter original substrate through an intermediate layer so that a thin film element layer and a terminal group formed in the element original substrate face a second resin substrate layer formed in the counter original substrate, to manufacture a substrate bonded body, a terminal portion sealing member is formed in a frame shape surrounding the terminal group between the element original substrate and the counter original substrate.

13 Claims, 13 Drawing Sheets

(51) Int. Cl.
| | |
|---|---|
| *H01L 51/50* | (2006.01) |
| *H01L 27/32* | (2006.01) |
| *H05B 33/02* | (2006.01) |
| *H05B 33/04* | (2006.01) |
| *H05B 33/06* | (2006.01) |
| *H05B 33/10* | (2006.01) |
| *G02F 1/1335* | (2006.01) |
| *G02F 1/1368* | (2006.01) |
| *H01L 27/12* | (2006.01) |
| *H01L 51/52* | (2006.01) |
| *H01L 51/00* | (2006.01) |
| *G02F 1/1333* | (2006.01) |

(52) U.S. Cl.
CPC ...... *G02F 1/1368* (2013.01); *G02F 1/133305* (2013.01); *G02F 1/133512* (2013.01); *G02F 1/133514* (2013.01); *H01L 27/1251* (2013.01); *H01L 27/32* (2013.01); *H01L 27/322* (2013.01); *H01L 27/3248* (2013.01); *H01L 51/003* (2013.01); *H01L 51/0097* (2013.01); *H01L 51/50* (2013.01); *H01L 51/5012* (2013.01); *H01L 51/5056* (2013.01); *H01L 51/5072* (2013.01); *H01L 51/5092* (2013.01); *H01L 51/5246* (2013.01); *H01L 51/5284* (2013.01); *H05B 33/02* (2013.01); *H05B 33/04* (2013.01); *H05B 33/06* (2013.01); *H05B 33/10* (2013.01); *G02F 2201/121* (2013.01); *G02F 2201/123* (2013.01)

(56) References Cited

U.S. PATENT DOCUMENTS

| | | | |
|---|---|---|---|
| 2004/0027530 | A1* | 2/2004 | Noiri ................. G02F 1/133351 349/158 |
| 2010/0148207 | A1* | 6/2010 | Ryutani .................. H01L 23/13 257/99 |
| 2010/0252599 | A1* | 10/2010 | Nakano ................... B26F 3/002 225/2 |
| 2013/0308076 | A1 | 11/2013 | Yasumatsu |
| 2015/0062456 | A1* | 3/2015 | Miyazaki ................ G06F 3/044 349/12 |
| 2016/0164030 | A1 | 6/2016 | Yasuda |

FOREIGN PATENT DOCUMENTS

| | | |
|---|---|---|
| WO | 2012/042822 A1 | 4/2012 |
| WO | 2015/008642 A1 | 1/2015 |

* cited by examiner

METHOD FOR MANUFACTURING DISPLAY DEVICE

TECHNICAL FIELD

The present disclosure relates to a method for manufacturing a display device.

BACKGROUND ART

In recent years, a flexible display device including a display panel using a resin substrate in place of a glass substrate conventionally used has been proposed for a display device such as an organic electroluminescent (EL) display device or a liquid crystal display device.

For example, PTL 1 discloses a method for manufacturing a flexible display device. The method includes forming an element layer including an organic EL element on a glass substrate, bonding a flexible substrate to the element layer, removing the glass substrate, and bonding another flexible substrate to a surface of the element layer exposed by the removing.

CITATION LIST

Patent Literature

PTL 1: JP 2009-205941 A

SUMMARY

Technical Problem

As the method for manufacturing a flexible display device, a method has been proposed in which a separation layer is formed on a support substrate such as a glass substrate, a resin substrate layer and a thin film element are formed in this order on the separation layer, and the resultant is irradiated with a laser beam from a side of the support substrate, and as a result, the adhesion of an interface between the separation layer and the resin substrate layer is decreased to peel the resin substrate layer and the thin film element from the support substrate.

Herein, by the above-described method in which the resin substrate layer is peeled from the support substrate, a flexible display device having a pair of resin substrate layers which are bonded through a frame-shaped sealing material is manufactured. In this case, when the support substrate on a side of one of the resin substrate layers is removed, an end portion of the other resin substrate layer is likely to be twisted due to a difference between stress applied to the other resin substrate layer and stress applied to a thin film formed on the other resin substrate layer. As a result, intervals between terminals in a terminal group provided at an end portion of a resin substrate are varied. Therefore, it is difficult to mount a flexible printed circuit (FPC) or the like on the terminal group, and a mounting failure occurs.

In view of such situations, it is an object of the present disclosure to suppress the mounting failure in the terminal group provided on the resin substrate layer.

Solution to Problem

To achieve the above-described object, a method for manufacturing a display device according to an aspect of the present invention includes: an element original substrate manufacturing step of forming a first resin substrate layer on a first support substrate and then forming a thin film element layer and a terminal group connected to the thin film element layer on the first resin substrate layer to manufacture an element original substrate, the element original substrate forming an element substrate; a counter original substrate manufacturing step of forming a second resin substrate layer on a second support substrate to manufacture a counter original substrate, the counter original substrate forming a counter substrate; a substrate bonding step of bonding the element original substrate to the counter original substrate through an intermediate layer so that the thin film element layer and the terminal group face the second resin substrate layer, to manufacture a substrate bonded body; a first peeling step of peeling the first support substrate from the substrate bonded body; a first film bonding step of bonding a first support film to the first resin substrate layer of the substrate bonded body obtained by peeling the first support substrate; a second peeling step of peeling the second support substrate from the substrate bonded body obtained by bonding the first support film; a second film bonding step of bonding a second support film to the second resin substrate layer of the substrate bonded body obtained by peeling the second support substrate; a terminal group exposure step of removing a part of the second resin substrate layer of the substrate bonded body obtained by bonding the second support film, to expose the terminal group on a surface; and a mounting step of mounting a mounting member on the terminal group exposed on the surface of the substrate bonded body, wherein in the substrate bonding step, a terminal portion sealing member is formed in a frame shape surrounding the terminal group between the element original substrate and the counter original substrate.

Advantageous Effects of Disclosure

According to the present disclosure, the terminal portion sealing member is formed in a frame shape surrounding the terminal group between the element original substrate and the counter original substrate in the substrate bonding step of bonding the element original substrate to the counter original substrate through the intermediate layer so that the thin film element layer and the terminal group formed in the element original substrate face the second resin substrate layer formed in the counter original substrate. Therefore, a mounting failure in the terminal group provided on the resin substrate layer can be suppressed.

DESCRIPTION OF EMBODIMENT

Embodiments of the present invention will be described in detail below with reference to the drawings. The present invention is not limited to the following embodiments.

First Embodiment

Figure 1:
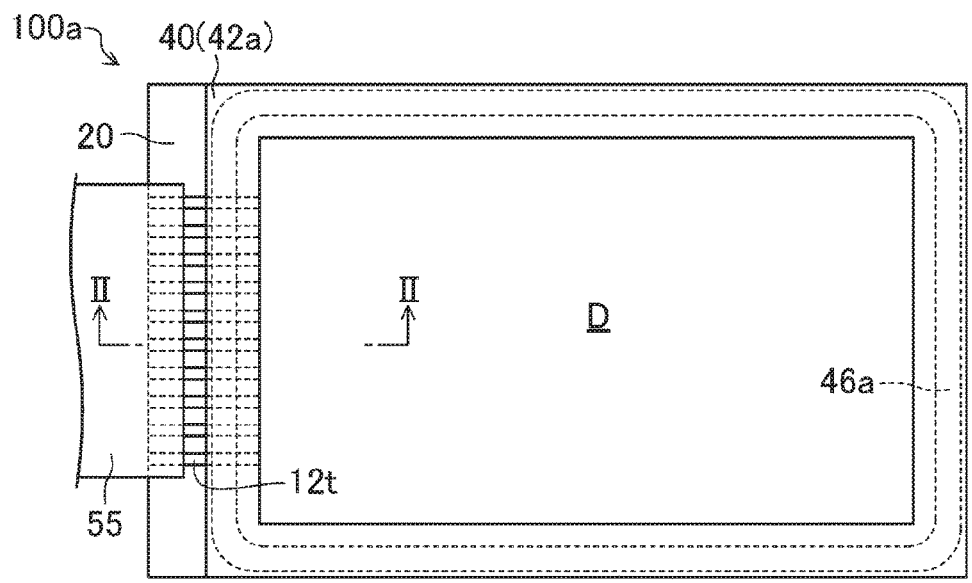
FIG. 1 is a plane view illustrating a schematic configuration of an organic EL display device according to a first embodiment of the present invention.
Figure 2:
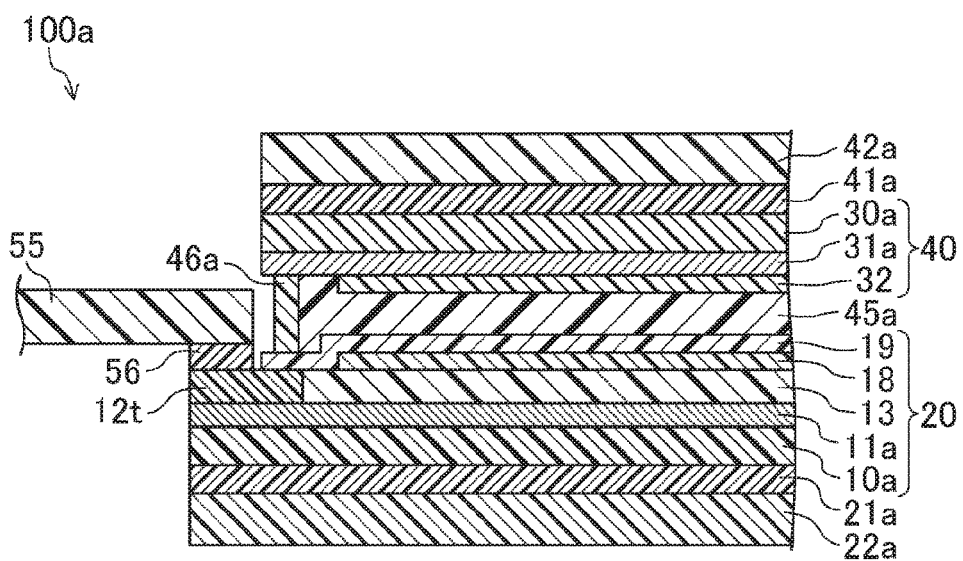
FIG. 2 is a cross-sectional view illustrating the schematic configuration of the organic EL display device taken along line II-II in FIG. 1.
Figure 3:
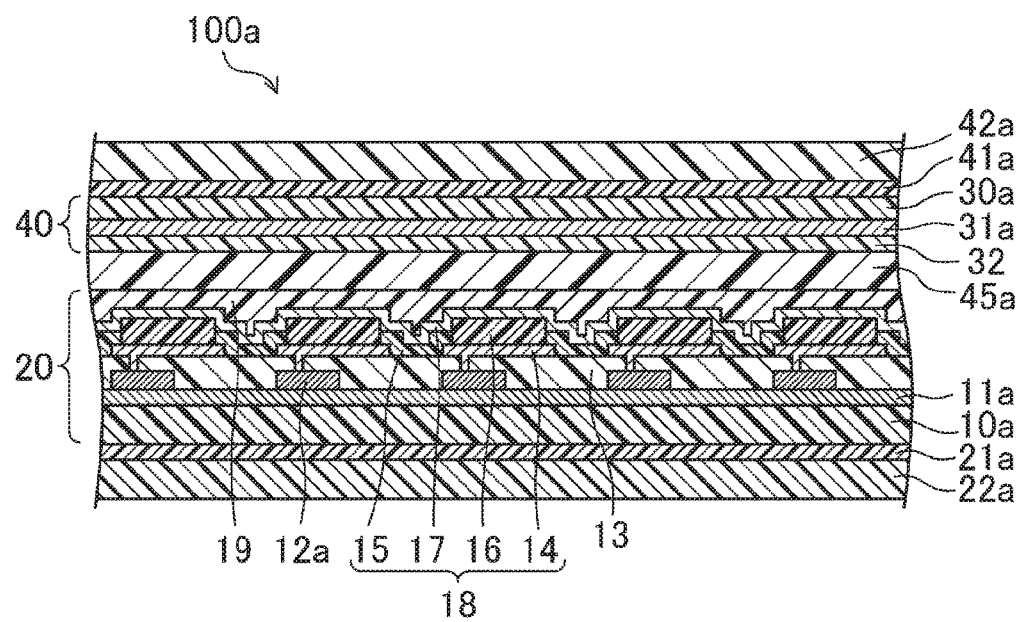
FIG. 3 is a cross-sectional view illustrating an internal configuration in a display region of the organic EL display device according to the first embodiment of the present invention.
Figure 4:
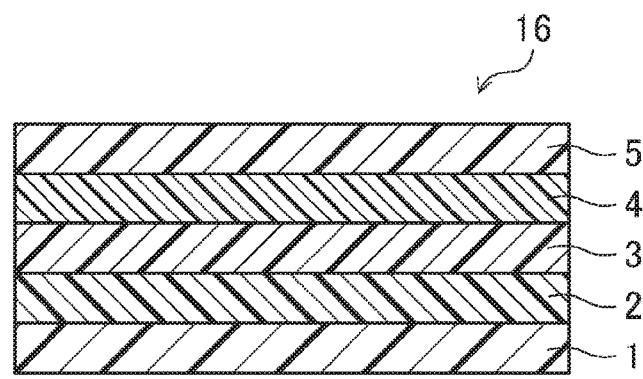
FIG. 4 is a cross-sectional view of an organic EL layer that constitutes the organic EL display device according to the first embodiment of the present invention.

FIGS. 1 to 21 illustrate a first embodiment of the display device according to the present invention. FIG. 1 is a plane view illustrating a schematic configuration of an organic EL display device 100a according to this embodiment. FIG. 2 is a cross-sectional view illustrating the schematic configuration of the organic EL display device 100a taken along line II-II in FIG. 1. FIG. 3 is a cross-sectional view illustrating an internal configuration in a display region D of the organic EL display device 100a. FIG. 4 is a cross-sectional view of an organic EL layer 16 that constitutes the organic EL display device 100a.

As illustrated in FIGS. 1, 2, and 3, the organic EL display device 100a includes an element substrate 20 and a counter substrate 40 that are provided so as to face each other, an adhesive material layer 45a and an element portion sealing member 46a that are provided between the element substrate 20 and the counter substrate 40, and a FPC 55 mounted on the element substrate 20 as a mounting member. As illustrated in FIGS. 1, 2, and 3, the organic EL display device 100a further includes a first support film layer 22a bonded to the element substrate 20 through an adhesive layer 21a and a second support film layer 42a bonded to the counter substrate 40 through an adhesive layer 41a. In the organic EL display device 100a, an organic EL display element layer 18 described below is provided in a rectangular shape as viewed in a plane view, as illustrated in FIG. 1. Therefore, the display region D where an image is displayed is formed in a rectangular shape and a plurality of pixels are arranged in a matrix in the display region D. In each of the pixels, for example, a sub pixel for red scale display, a sub pixel for green scale display, and a sub pixel for blue scale display are arranged so as to be adjacent to one another.

As illustrated in FIGS. 2 and 3, the element substrate 20 includes a first resin substrate layer 10a, the organic EL element layer 18 provided indirectly on the first resin substrate layer 10a, and a sealing film 19 provided covering the organic EL element layer 18. In the element substrate 20, a first base coat layer 11a, a plurality of TFTs 12a, and an interlayer insulating film 13 are provided in this order from a side of the first resin substrate layer 10a between the first resin substrate layer 10a and the organic EL element layer 18, as illustrated in FIG. 3. In a frame region surrounding the display region D, a terminal group 12t for inputting an electrical signal from the FPC 55 into the organic EL element layer 18 through a corresponding TFT 12a is provided on the first base coat layer 11a, as illustrated in FIGS. 1 and 2.

For example, the first resin substrate layer 10a has a thickness of from about 5 μm to about 50 μm and is formed from a transparent resin material having heat resistance (about 500° C.), such as a polyimide resin. Herein, when the thickness of the first resin substrate layer 10a is less than 5 μm, mechanical strength necessary for a substrate is unlikely to be secured. When the thickness of the first resin substrate layer 10a is greater than 50 μm, it is difficult to stably peel a first support substrate 8a and a first separation layer 9a in a first peeling step described below.

As illustrated in FIGS. 2 and 3, the first base coat layer 11a is provided on the first resin substrate layer 10a. Herein, the first base coat layer 11a is formed, for example, from an inorganic insulating film such as a silicon oxide film, an aluminum oxide film, a silicon nitride film, and a silicon carbonitride film.

As illustrated in FIG. 3, the TFTs 12a are each a switching element provided in each sub pixel and on the first base coat layer 11a. Herein, the TFTs 12a include, for example, a gate electrode provided on the first base coat layer 11a, a gate insulating film provided covering the gate electrode, a semiconductor layer provided on the gate insulating film while overlapping the gate electrode, and a source electrode and a drain electrode provided on the semiconductor layer while opposing to each other. In this embodiment, a bottom gate type TFT is exemplified as the TFTs 12a. However, the TFTs 12a may be a top gate type TFT. Examples of a material constituting the semiconductor layer of the TFTs 12a include amorphous silicon, low-temperature polysilicon, and In—Ga—Zn—O-based oxide semiconductors.

As illustrated in FIG. 3, the interlayer insulating film 13 is provided covering a part other than one part of the drain electrode of each of the TFTs 12a. Herein, the interlayer insulating film 13 is formed, for example, from a transparent organic resin material such as an acrylic resin.

As illustrated in FIG. 3, the organic EL element layer 18 includes a plurality of first electrodes 14, an edge cover 15, and a plurality of organic EL layers 16 and a second electrode 17 that are provided in this order on the interlayer insulating film 13.

As illustrated in FIG. 3, the first electrodes 14 are provided in a matrix on the interlayer insulating film 13 and correspond to a plurality of sub pixels. As illustrated in FIG. 3, the first electrodes 14 are each connected to the drain electrode of a corresponding TFT 12a via a contact hole formed in the interlayer insulating film 13. The first electrodes 14 each have a function of injecting holes (holes) into the organic EL layers 16. To improve the hole injection efficiency into the organic EL layers 16, the first electrodes 14 are preferably formed from a material having a large work function. Herein, examples of a material constituting the first electrodes 14 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). In addition, the material constituting the first electrodes 14 may be, for example, an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al). The material constituting the first electrodes 14 may be an electrically conductive oxide such as tin oxide (SnO), zinc oxide (ZnO), indium tin oxide (ITO), or indium zinc oxide (IZO). The first electrodes 14 may be each formed by layering a plurality of layers formed from the above described materials. Examples of the material having a large work function include indium tin oxide (ITO) and indium zinc oxide (IZO).

As illustrated in FIG. 3, the edge cover 15 is provided in a lattice shape and covers a peripheral portion of each of the first electrodes 14. Examples of a material constituting the edge cover 15 include inorganic films of silicon oxide ($SiO_2$), silicon nitride ($SiN_x$ (wherein x is a positive number)) such as trisilicon tetranitride ($Si_3N_4$), and silicon oxynitride (SiNO), and organic films of a polyimide resin, an acrylic resin, a polysiloxane resin, and a novolac resin.

As illustrated in FIG. 3, the organic EL layers 16 are provided in a matrix on each of the first electrodes 14 and correspond to a plurality of sub pixels. As illustrated in FIG. 4, each of the organic EL layers 16 includes a hole injecting layer 1, a hole transport layer 2, a light emitting layer 3, an electron transport layer 4, and an electron injecting layer 5 that are provided in this order on each of the first electrodes 14.

The hole injecting layer 1 is also referred to as a positive electrode buffer layer, and has a function of bringing energy levels of the first electrodes 14 and the organic EL layers 16 close to each other to improve the hole injection efficiency from the first electrodes 14 into the organic EL layers 16. Examples of a material constituting the hole injecting layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function of improving the hole transport efficiency from the first electrodes 14 to the organic EL layers 16. Examples of a material constituting the hole transport layer 2 include porphyrin derivatives, aromatic tertiary amine compounds, styrylamine derivatives, polyvinyl carbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light emitting layer 3 is a region where holes and electrons are each injected from the first electrodes 14 and the second electrode 17 during application of voltage by the first electrodes 14 and the second electrode 17 and recombination of the holes and the electrons is caused. Herein, the light emitting layer 3 is formed from a material having high light emitting efficiency. Examples of a material constituting the light emitting layer 3 include metal oxynoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzthiazole derivatives, styryl derivatives, styrylamine derivatives, bisstyrylbenzene derivatives, trisstyrylbenzne derivatives, perylene derivatives, perinone derivatives, aminopyrene derivatives, pyridine derivatives, rhodamine derivatives, acridine derivatives, phenoxazone, quinacridone derivatives, rubrene, poly-p-phenylene vinylene, and polysilane.

The electron transport layer 4 has a function of efficiently transporting electrons to the light emitting layer 3. Examples of a material constituting the electron transport layer 4 include as an organic compound, oxadiazole derivatives, triazole derivatives, benzoquinone derivatives, naphthoquinone derivatives, anthraquinone derivatives, tetracyanoanthraquinodimethan derivatives, diphenoquinone derivatives, fluorenone derivatives, silole derivatives, and metal oxynoid compounds.

The electron injecting layer 5 has a function of bringing energy levels of the second electrode 17 and the organic EL layers 16 close to each other to improve the electron injection efficiency from the second electrode 17 into the organic EL layers 16. This function can decrease the drive voltage of the organic EL element layer 18. The electron injecting layer 5 is also referred to as a negative electrode buffer layer. Examples of a material constituting the electron injecting layer 5 include inorganic alkaline compounds such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 3, the second electrode 17 is provided covering each of the organic EL layers 16 and the edge cover 15. The second electrode 17 has a function of injecting electrons into the organic EL layers 16. To improve the electron injection efficiency into the organic EL layers 16, the second electrode 17 is preferably formed from a material having a small work function. Examples of a material constituting the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 17 may be formed from an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), or lithium fluoride (LiF)/calcium (Ca)/aluminum (Al). The second electrode 17 may be formed from an electrically conductive oxide such as tin oxide (SnO), zinc oxide (ZnO), indium tin oxide (ITO), or indium zinc oxide (IZO). The second electrode 17 may be each formed by layering a plurality of layers formed from the materials described above. Examples of the material having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The sealing film 19 has a function of covering the organic EL element layer 18 to protect the organic EL element layer 18 against moisture and oxygen. Examples of a material constituting the sealing film 19 include inorganic materials such as silicon oxide ($SiO_2$), aluminum oxide ($Al_2O_3$), silicon nitride ($SiN_x$ (wherein x is a positive number)) such as trisilicon tetranitride ($Si_3N_4$), and silicon carbonitride (SiCN). The sealing film 19 is a single layer film or a layered film of inorganic films formed from the inorganic materials or a layered film of the inorganic films formed from the inorganic materials and an organic film formed from the following organic materials. Examples of the organic materials constituting the sealing film 19 include acrylates, polyureas, parylene, polyimides, and polyamides.

As illustrated in FIGS. 2 and 3, the counter substrate 40 includes a second resin substrate layer 30a, a second base coat layer 31a provided on the second resin substrate layer 30a, and a color filter layer 32 provided on the second base coat layer 31a.

For example, the second resin substrate layer 30a has a thickness of from about 5 μm to about 50 μm and is formed from a transparent resin material having heat resistance (about 500° C.), such as a polyimide resin. Herein, when the thickness of the second resin substrate layer 30a is less than 5 μm, mechanical strength necessary for a substrate is unlikely to be secured. When the thickness of the second resin substrate layer 30a is greater than 50 μm, it is difficult to stably peel a second support substrate 8b and a second separation layer 9b in a second peeling step described below.

The second base coat layer 31a is formed, for example, from an inorganic insulating film such as a silicon oxide film, an aluminum oxide film, a silicon nitride film, and a silicon carbonitride film.

The color filter layer 32 includes a black matrix (not illustrated) provided in a lattice shape so as to block light between a plurality of sub pixels, and a plurality of colored layers (not illustrated) each provided between lattices of the black matrix and including red colored layers, green colored layers, or blue colored layers arranged in a matrix.

The adhesive material layer 45a is provided as an intermediate layer between the element substrate 20 and the counter substrate 40 and for example, is formed from an adhesive such as a thermosetting epoxy-based adhesive. For example, the adhesive material layer 45a may contain a metal oxide such as calcium oxide (CaO), barium oxide (BaO), or aluminum oxide ($Al_2O_3$), activated carbon, silica gel, zeolite, or the like, and have a getter function.

Figure 13:
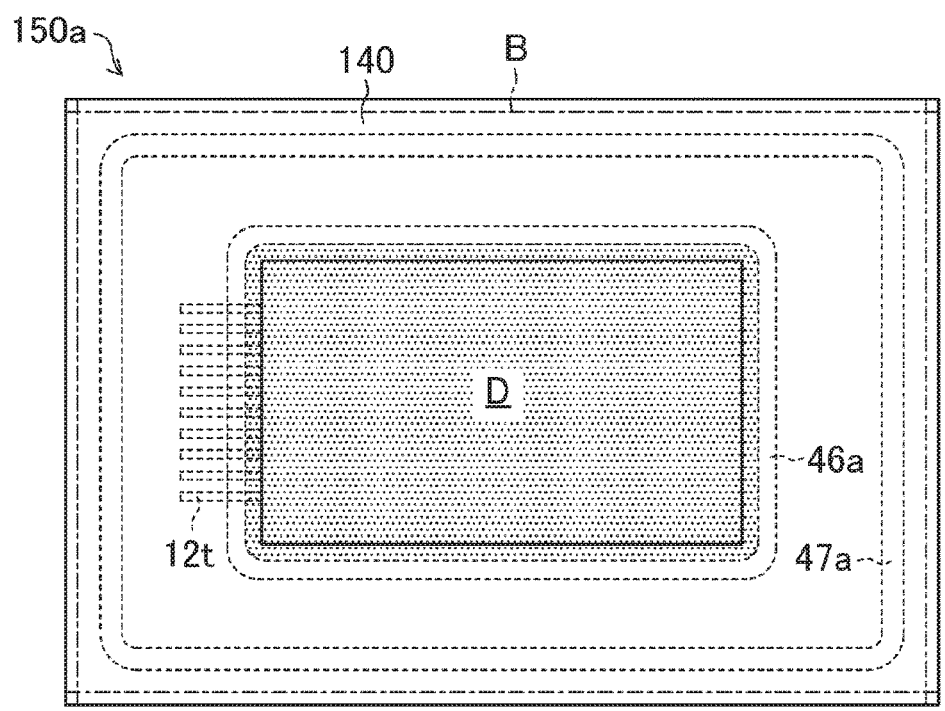
FIG. 13 is a first plane view illustrating the method for manufacturing the organic EL display device according to the first embodiment of the present invention, which corresponds to the cross-sectional view of FIG. 12.

As illustrated in FIGS. 2 and 13 described below, the element portion sealing member 46a is provided in a frame shape surrounding the adhesive material layer 45a. Examples of a material forming the element portion sealing member 46a include a thermosetting epoxy-based resin. For example, the element portion sealing member 46a may contain a metal oxide such as calcium oxide (CaO), barium oxide (BaO), or aluminum oxide ($Al_2O_3$), activated carbon, silica gel, zeolite, or the like, and have a getter function. The element portion sealing member 46a includes a spacer for keeping an interval between the element substrate 20 and the counter substrate 40.

As illustrated in FIGS. 1 and 2, the FPC 55 is pressure-bonded to the terminal group 12t on the element substrate 20 through an anisotropic conductive film (ACF) 56.

For example, the adhesive layers 21a and 41a are formed from a thermosetting or ultraviolet-curable acrylic-based, epoxy-based, or silicone-based adhesive.

The first support film layer 22a has a thickness of from about 20 μm to about 100 μm, and is formed, for example, from a flexible film of a synthetic resin such as polyethylene terephthalate, polyethylene naphthalate, a polycarbonate, a polyetherimide, a polyarylate, or a polyimide. When the thickness of the first support film layer 22a is less than 20 μm, it is difficult to reinforce the first resin substrate layer 10a. When the thickness of the first support film layer 22a is greater than 100 μm, the bending properties of the display device may decrease.

The second support film layer 42a has a thickness of about 20 μm, and is formed, for example, from a flexible film of a synthetic resin such as polyethylene terephthalate, polyethylene naphthalate, a polycarbonate, a polyetherimide, a polyarylate, or a polyimide.

The organic EL display device 100a having the above-described configuration has flexibility. When in each sub pixel, light is appropriately emitted by the light emitting layer 3 of each of the organic EL layers 16 via each of the TFTs 12a, the organic EL display device 100a can display an image.

Figure 5:
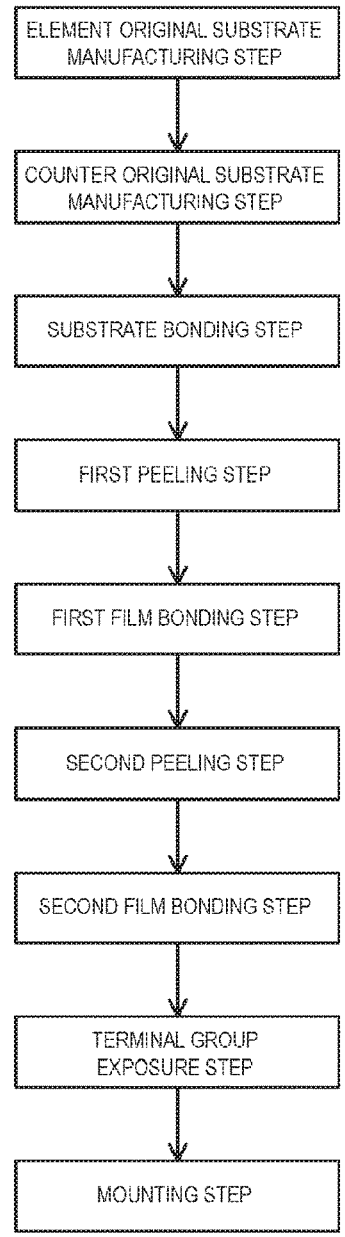
FIG. 5 is a flowchart showing a method for manufacturing the organic EL display device according to the first embodiment of the present invention.

Next, a method for manufacturing the organic EL display device 100a of this embodiment will be described using FIGS. 5 to 21. FIG. 5 is a flowchart showing the method for manufacturing the organic EL display device 100a. FIGS. 6 to 12, 14 to 18, 20, and 21 are first to fourteenth cross-sectional views illustrating the method for manufacturing the organic EL display device 100a. FIG. 13 is a first plane view illustrating the method for manufacturing the organic EL display device 100a, which corresponds to the cross-sectional view of FIG. 12. FIG. 19 is a second plane view illustrating the method for manufacturing the organic EL display device, which corresponds to the cross-sectional view of FIG. 18. As illustrated in FIG. 5, the method for manufacturing the organic EL display device 100a of the embodiment includes an element original substrate manufacturing step, a counter original substrate manufacturing step, a substrate bonding step, a first peeling step, a first film bonding step, a second peeling step, a second film bonding step, a terminal group exposure step, and a mounting step.

Element Original Substrate Manufacturing Step

Figure 6:
FIG. 6 is a first cross-sectional view illustrating the method for manufacturing the organic EL display device according to the first embodiment of the present invention.

A film of metal such as molybdenum (Mo) is formed so as to have a thickness of from about 100 nm to about 500 nm on a surface of the first support substrate 8a such as a glass substrate, for example, by a sputtering method, to form the first separation layer 9a (see FIG. 6). To enhance the wetting properties of the film of metal such as molybdenum (Mo), the surface of the first support substrate 8a may be subjected to a dry surface treatment such as a reduced pressure plasma treatment, a normal pressure plasma treatment, or a UV treatment, or a dry surface treatment in which a surface treatment agent such as a silane coupling agent is applied, before the formation of the metal film.

Subsequently, a polyimide precursor is applied to a surface of the first separation layer 9a, for example, by a spin coating method, a slit coating method, a screen printing method, or the like. After then, the applied film is baked at about 350° C. to 500° C., to form the first resin substrate layer 10a having a thickness of from about 5 μm to about 50 μm, as illustrated in FIG. 6.

Figure 7:
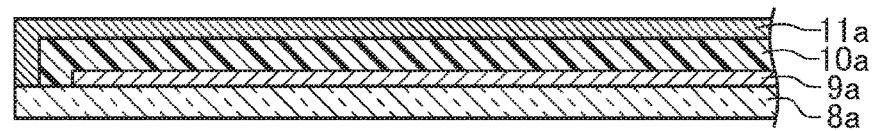
FIG. 7 is a second cross-sectional view illustrating the method for manufacturing the organic EL display device according to the first embodiment of the present invention.

A silicon oxide film, an aluminum oxide film, a silicon nitride film, a silicon carbonitride film, or the like is formed on a surface of the first resin substrate layer 10a so as to have a thickness of from about 50 nm to about 1000 nm, for example, by a plasma chemical vapor deposition (CVD) method, a thermal CVD method, a sputtering method, or the like. Thus, the first base coat layer 11a is formed as illustrated in FIG. 7.

Figure 8:
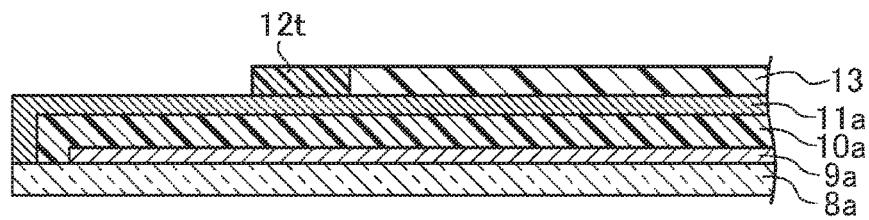
FIG. 8 is a third cross-sectional view illustrating the method for manufacturing the organic EL display device according to the first embodiment of the present invention.

Subsequently, the TFTs 12a (see FIG. 3), the terminal group 12t, and the interlayer insulating film 13 are formed on a surface of the first base coat layer 11a by a known method, as illustrated in FIG. 8.

Figure 9:
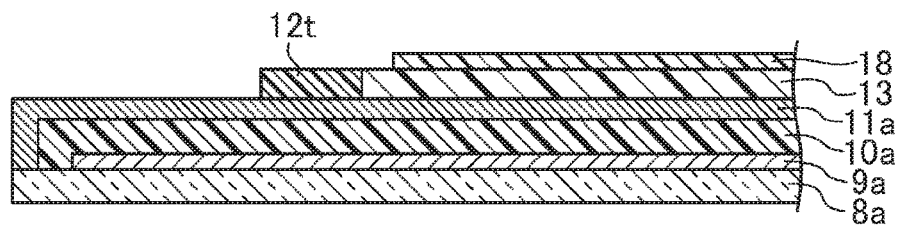
FIG. 9 is a fourth cross-sectional view illustrating the method for manufacturing the organic EL display device according to the first embodiment of the present invention.

Further, the first electrodes 14, the edge cover 15, the organic EL layers 16 (the hole injecting layer 1, the hole transport layer 2, the light emitting layer 3, the electron transport layer 4, the electron injecting layer 5), and the second electrode 17 are formed on a surface of the interlayer insulating film 13 by a known method, to form the organic EL element layer 18, as illustrated in FIG. 9.

Figure 10:
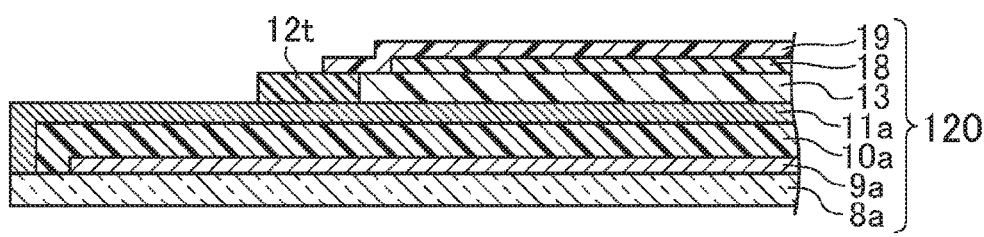
FIG. 10 is a fifth cross-sectional view illustrating the method for manufacturing the organic EL display device according to the first embodiment of the present invention.

A silicon oxide film, an aluminum oxide film, a silicon nitride film, a silicon carbonitride film, or the like is finally formed so as to cover the organic EL element layer 18 and have a thickness of from about 3 μm to about 5 μm, for example, by a plasma CVD method, a thermal CVD method, a vacuum vapor deposition method, a sputtering method, or the like. Thus, the sealing film 19 is formed as illustrated in FIG. 10.

As described above, an element original substrate 120 can be manufactured.

Counter Original Substrate Manufacturing Step

Figure 11:
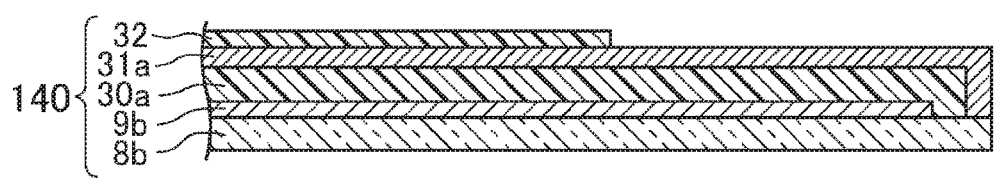
FIG. 11 is a sixth cross-sectional view illustrating the method for manufacturing the organic EL display device according to the first embodiment of the present invention.

A film of metal such as molybdenum (Mo) is formed so as to have a thickness of from about 100 nm to about 500 nm on a surface of the second support substrate 8b such as a glass substrate, for example, by a sputtering method or the like, to form the second separation layer 9b (see FIG. 11).

Subsequently, a polyimide precursor is applied to a surface of the second separation layer 9b, for example, by a spin coating method, a slit coating method, a screen printing method, or the like. After then, the applied film is baked at about 350° C. to 500° C., to form the second resin substrate layer 30a having a thickness of from about 5 μm to about 50 μm (see FIG. 11).

A silicon oxide film, an aluminum oxide film, a silicon nitride film, a silicon carbonitride film, or the like is formed on a surface of the second resin substrate layer 30a so as to have a thickness of from about 50 nm to about 1000 nm, for example, by a plasma CVD method, a thermal CVD method, a sputtering method, or the like. Thus, the second base coat layer 31a is formed (see FIG. 11).

The black matrix and the colored layers (the red colored layers, the green colored layers, the blue colored layers) are finally formed on a surface of the second base coat layer 31a by a known method. Thus, the color filter layer 32 is formed as illustrated in FIG. 11.

As described above, a counter original substrate 140 can be manufactured.

Substrate Bonding Step

On a surface of the element original substrate 120, which is manufactured in the element original substrate manufacturing step, closer to the sealing film 19, a sealing resin forming the element portion sealing member 46a is disposed in a frame shape surrounding the display region D by a dispenser method, a screen printing method, or the like, and a sealing resin forming a terminal portion sealing member 47a is disposed in a frame shape surrounding the terminal group 12t (see FIG. 13).

Subsequently, an adhesive resin forming the adhesive material layer 45a (dot portion in FIG. 13) is disposed inside the sealing resin forming the element portion sealing member 46a, for example, by a dispenser method, a screen printing method, an ink-jet printing method, or the like. The viscosity of the sealing resin and the adhesive resin is desirably from about 100 Pa·s to about 1000 Pa·s. In consideration of heat resistance of the light emitting layer 3, the curing temperature of the sealing resin and the adhesive resin that have thermosetting properties is desirably 100° C. or less (preferably 80° C. or less). In this embodiment, the adhesive material layer 45a formed from a thermosetting adhesive resin is exemplified, but the adhesive material layer 45a may be a sealing resin layer (45a) formed from a non-curable sealing resin.

The element original substrate 120 in which the sealing resin and the adhesive resin are disposed and the counter original substrate 140 manufactured in the counter original substrate manufacturing step are bonded under a reduced pressure atmosphere so that the organic EL element layer 18 and the terminal group 12t face the second resin substrate layer 30a. After then, the reduced pressure atmosphere is released to pressurize outer surfaces of the element original substrate 120 and the counter original substrate 140 (see FIG. 12).

Figure 12:
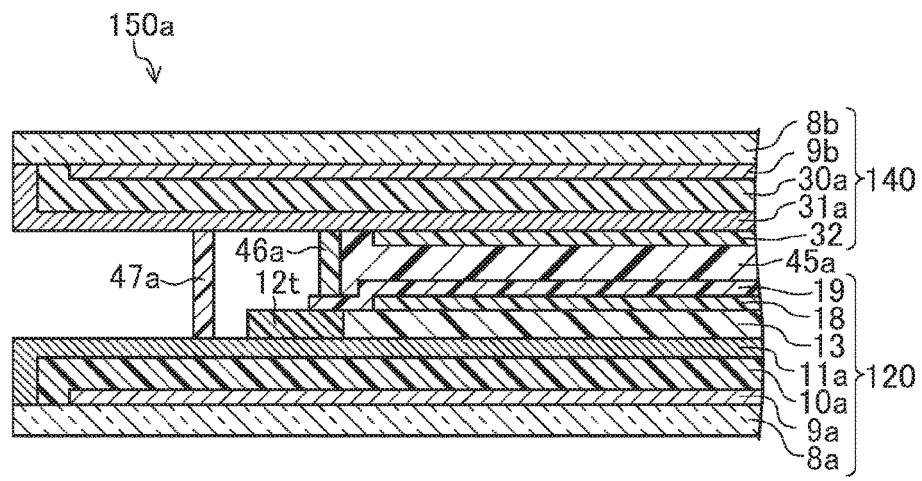
FIG. 12 is a seventh cross-sectional view illustrating the method for manufacturing the organic EL display device according to the first embodiment of the present invention.

The sealing resin and the adhesive resin that are disposed between the element original substrate 120 and the counter original substrate 140 are finally subjected to a heating treatment, and the sealing resin and the adhesive resin are cured. Thus, the element portion sealing member 46a, the terminal portion sealing member 47a, and the adhesive material layer 45a are formed as illustrated in FIGS. 12 and 13.

As described above, a substrate bonded body 150a can be manufactured.

First Peeling Step

A peripheral end portion of each of the element original substrate 120 and the counter original substrate 140 is cut along a cutting line B having a frame shape (see FIGS. 13 and 14) by a $CO_2$ laser, or the like, so that end surfaces of the first separation layer 9a and the second separation layer 9b of the element original substrate 120 and the counter original substrate 140 of the substrate bonded body 150a obtained in the substrate bonding step are exposed on a surface.

Figure 14:
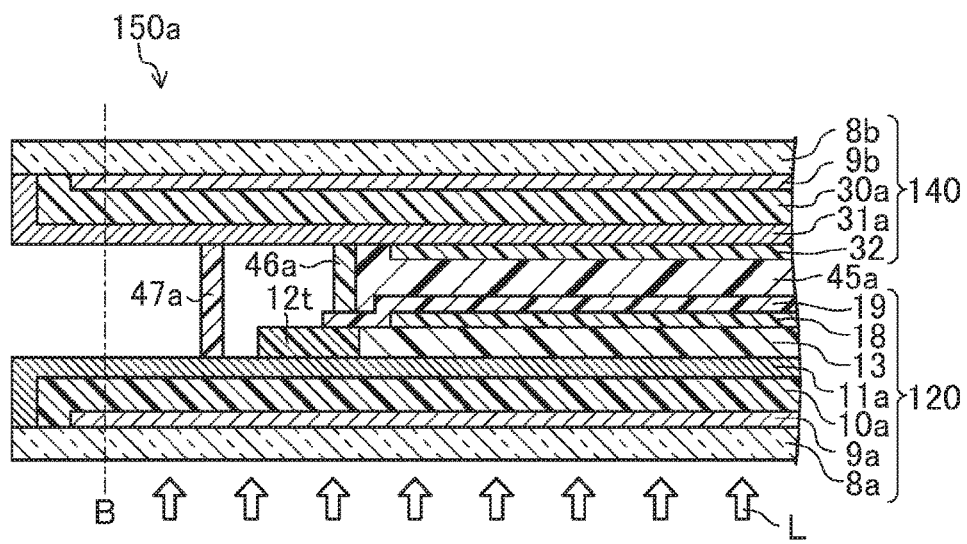
FIG. 14 is an eighth cross-sectional view illustrating the method for manufacturing the organic EL display device according to the first embodiment of the present invention.

Subsequently, a body to be treated in which the peripheral end portions of the substrates are cut (the substrate bonded body 150a) is irradiated with a laser beam L from a side of the first support substrate 8a, for example, by an XeCl excimer laser (wavelength: 308 nm), or the like, as illustrated in FIG. 14.

Figure 15:
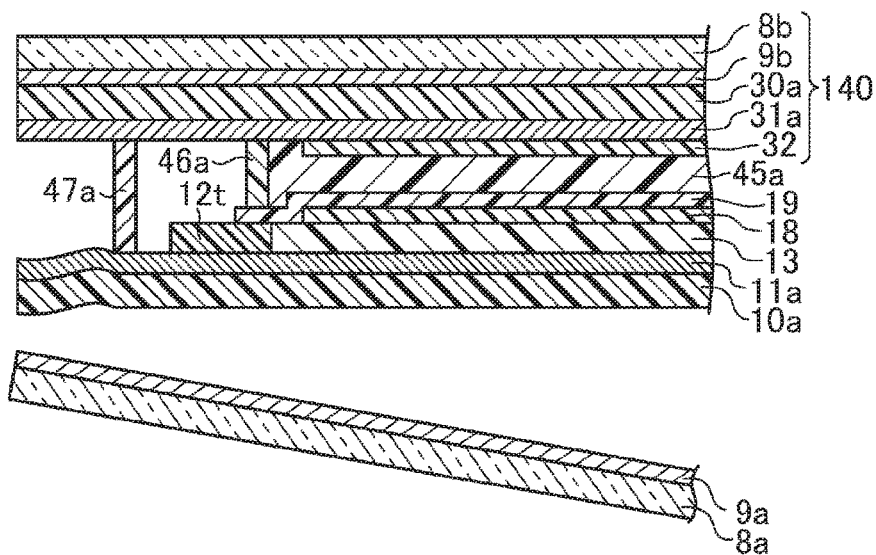
FIG. 15 is a ninth cross-sectional view illustrating the method for manufacturing the organic EL display device according to the first embodiment of the present invention.

As illustrated in FIG. 15, the first support substrate 8a and the first separation layer 9a are separated from the body to be treated that is irradiated with a laser beam L (the substrate bonded body 150a). Thus, the first support substrate 8a and the first separation layer 9a are peeled. At that time, an end portion of the first resin substrate layer 10a and the first base coat layer 11a on an outer side of the terminal portion sealing member 47a becomes twisted, as illustrated in FIG. 15, due to a difference between stress applied to the first resin substrate layer 10a and stress applied to the first base coat layer 11a.

First Film Bonding Step

Figure 16:
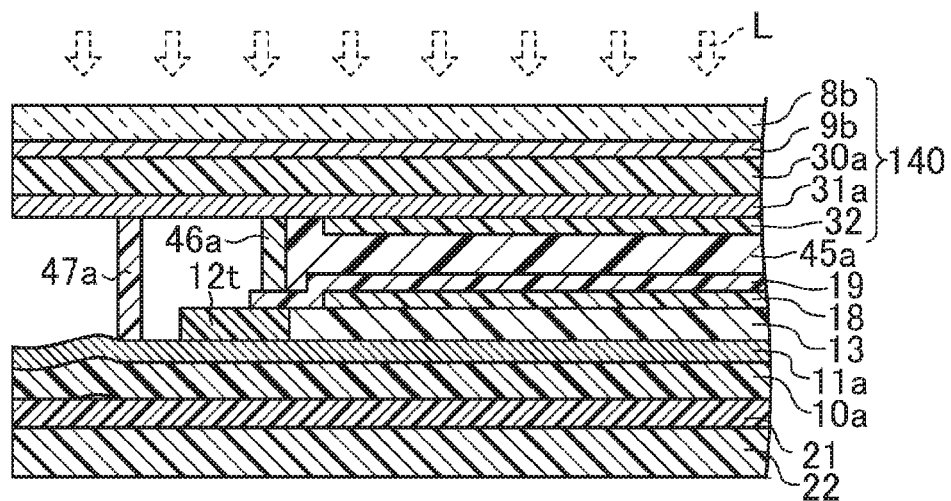
FIG. 16 is a tenth cross-sectional view illustrating the method for manufacturing the organic EL display device according to the first embodiment of the present invention.

A first support film 22 is bonded through the adhesive layer 21 to a surface of the substrate bonded body obtained by peeling the first support substrate 8a and the first separation layer 9a in the first peeling step, for example, as illustrated in FIG. 16. The first support film 22 includes a thermosetting or ultraviolet-curable adhesive layer 21 on a surface thereof, has a thickness of from about 20 μm to about 100 μm, and is formed from a synthetic resin film. After then, the adhesive layer 21 is cured. Herein, a whole region of the adhesive layer 21 may be cured, or only a region where a mounting member is mounted may be cured to improve the bending properties of the display device.

Second Peeling Step

The body to be treated in which the first support film 22 is bonded in the first film bonding step (the substrate bonded body 150a) is irradiated with a laser beam L from a side of the second support substrate 8b, for example, by an XeCl excimer laser (wavelength: 308 nm), or the like (see FIG. 16).

Figure 17:
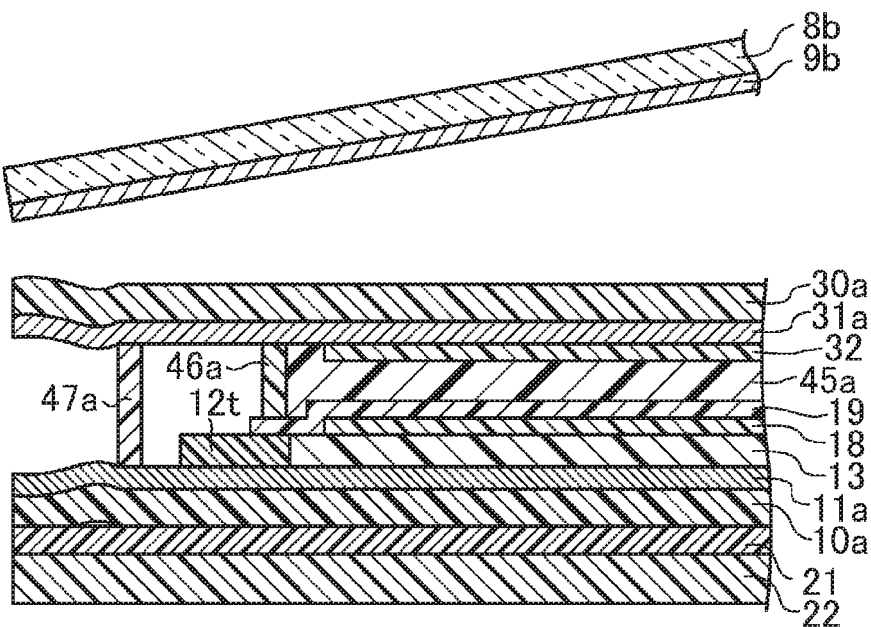
FIG. 17 is an eleventh cross-sectional view illustrating the method for manufacturing the organic EL display device according to the first embodiment of the present invention.

As illustrated in FIG. 17, the second support substrate 8b and the second separation layer 9b are separated from the body to be treated that is irradiated with a laser beam L (the substrate bonded body 150a). Thus, the second support substrate 8b and the second separation layer 9b are peeled. At that time, a part of peripheral end portion of the counter original substrate 140 on the outer side of the terminal portion sealing member 47a becomes twisted, as illustrated in FIG. 17, due to a difference between stress applied to the second resin substrate layer 30a and stress applied to the second base coat layer 31a.

Second Film Bonding Step

Figure 18:
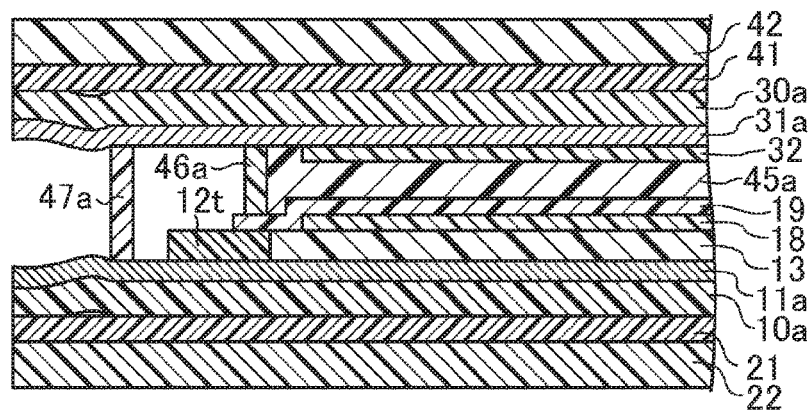
FIG. 18 is a twelfth cross-sectional view illustrating the method for manufacturing the organic EL display device according to the first embodiment of the present invention.
Figure 19:
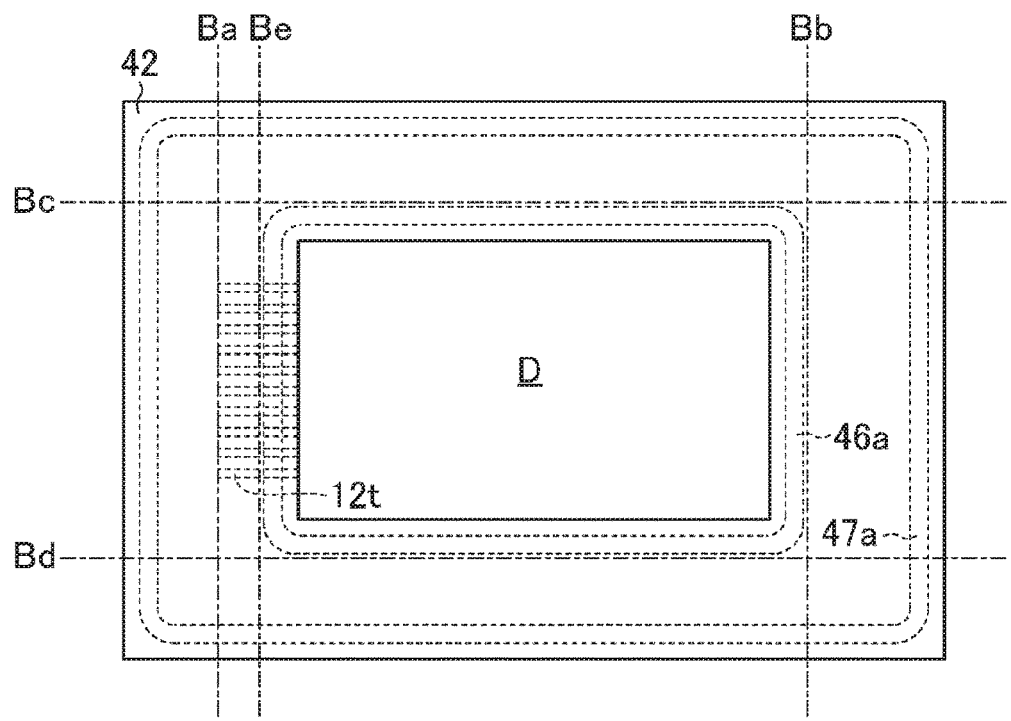
FIG. 19 is a second plane view illustrating the method for manufacturing the organic EL display device according to the first embodiment of the present invention, which corresponds to the cross-sectional view of FIG. 18.

A second support film 42 is bonded through the adhesive layer 41 to a surface of the substrate bonded body obtained by peeling the second support substrate 8b and the second separation layer 9b in the second peeling step, for example, as illustrated in FIG. 18. The second support film 42 includes a thermosetting or ultraviolet-curable adhesive layer 41 on a surface thereof, has a thickness of from about 20 μm to about 100 μm, and is formed from a synthetic resin film. After then, the adhesive layer 41 is cured. Since a mounting member is not mounted on a side of the second resin substrate layer 30a, the adhesive layer 41 may be configured by an optically colorless transparent non-curable double coated tape or adhesive.

Terminal Group Exposure Step

Figure 20:
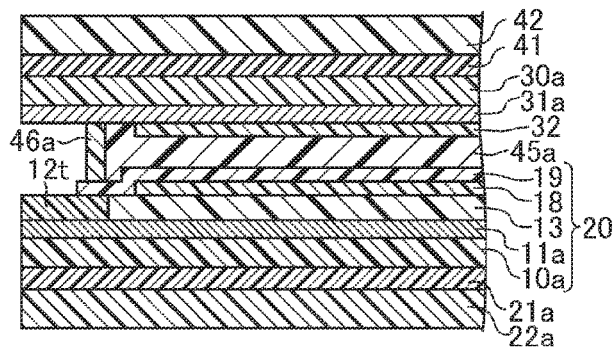
FIG. 20 is a thirteenth cross-sectional view illustrating the method for manufacturing the organic EL display device according to the first embodiment of the present invention.

A layered body of the first support film 22, the adhesive layer 21, the first resin substrate layer 10a, and the first base coat layer 11a, and a layered body of the second support film 42, the adhesive layer 41, the second resin substrate layer 30a, and the second base coat layer 31a of the body to be treated in which the second support film 42 is bonded in the second film bonding step (the substrate bonded body 150a) are cut along cutting lines Ba, Bb, Bc, and Bd (see FIG. 19) by a $CO_2$ laser, a cutter, or the like. Thus, the element substrate 20 is manufactured as illustrated in FIG. 20.

Figure 21:
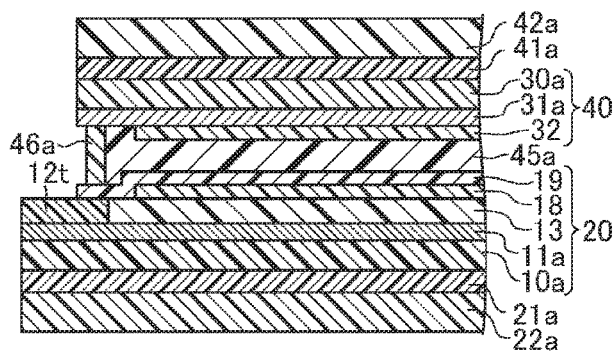
FIG. 21 is a fourteenth cross-sectional view illustrating the method for manufacturing the organic EL display device according to the first embodiment of the present invention.

The layered body of the second support film 42, the adhesive layer 41, the second resin substrate layer 30a, and the second base coat layer 31a that is cut along the cutting lines Ba, Bb, Bc, and Bd is cut along a cutting line Be (see FIG. 19) by a $CO_2$ laser, a cutter, or the like. Thus, the counter substrate 40 is manufactured and the terminal group 12t on the element substrate 20 is exposed on a surface as illustrated in FIG. 21.

Mounting Step

The FPC 55 is mounted through the ACF 56 on the terminal group 12t on the element substrate 20 that is exposed in the terminal group exposure step.

According to the method for manufacturing the organic EL display device 100a of the embodiment as described above, the following effects (1) to (8) can be obtained.

(1) In the substrate bonding step of bonding the element original substrate 120 and the counter original substrate 140, the terminal portion sealing member 47a is formed in a frame shape surrounding the terminal group 12t between the element original substrate 120 and the counter original substrate 140. For this reason, even when the end portions of the first resin substrate layer 10a and the first base coat layer 11a become twisted due to a difference between the stress applied to the first resin substrate layer 10a and the stress applied to the first base coat layer 11a by peeling the first support substrate 8a and the first separation layer 9a from the substrate bonded body 150a in the subsequent first peeling step, a position of the twist is outside the terminal portion sealing member 47a and apart from the terminal group 12t. Therefore, different intervals between terminals in the terminal group 12t due to the twist of the end portions of the first resin substrate layer 10a and the first base coat layer 11a are reduced. Accordingly, in the subsequent mounting step, the FPC 55 is surely mounted on the terminal group 12t, and a mounting failure in the terminal group 12t provided on the first resin substrate layer 10a can be suppressed.

(2) In the substrate bonding step, the element portion sealing member 46a is formed in a frame shape surrounding the adhesive material layer 45a between the element original substrate 120 and the counter original substrate 140. Therefore, excessive spread of the adhesive material layer 45a can be suppressed.

(3) In the substrate bonding step, the terminal portion sealing member 47a is formed in a shape surrounding the element portion sealing member 46a. Therefore, the amount of the adhesive resin forming the adhesive material layer 45a for bonding the element original substrate 120 and the counter original substrate 140 can be reduced, which reduces the cost.

(4) In the first peeling step, the substrate bonded body 150a is irradiated with a laser beam L from the side of the first support substrate 8a that is transparent, and in the second peeling step, the substrate bonded body 150a is irradiated with a laser beam L from the side of the second support substrate 8b that is transparent. Thus, the first support substrate 8a and the second support substrate 8b are mostly kept apart from the substrate bonded body 150a. Therefore, the first support substrate 8a and the second support substrate 8b can be easily peeled from the substrate bonded body 150a.

(5) In the element original substrate manufacturing step, the first separation layer 9a is formed between the first support substrate 8a and the first resin substrate layer 10a, and in the counter original substrate manufacturing step, the second separation layer 9b is formed between the second support substrate 8b and the second resin substrate layer 30a. Thus, the first separation layer 9a and the second separation layer 9b function as a heat-light exchange film. Therefore, the first resin substrate layer 10a and the second resin substrate layer 30a are not directly irradiated with a laser beam L, and damage of the first resin substrate layer 10a and the second resin substrate layer 30a by the laser beam L can be suppressed.

(6) In the element original substrate manufacturing step, the first base coat layer 11a is formed between the first resin substrate layer 10a and the organic EL element layer 18 and the terminal group 12t, and in the counter original substrate manufacturing step, the second base coat layer 31a is formed on the second resin substrate layer 30a. Thus, the first base coat layer 11a and the second base coat layer 31a function as a protection film. Therefore, damage of the first resin substrate layer 10a and the second resin substrate layer 30a by a treatment such as dry etching, wet etching, peeling of a resist, and baking can be suppressed.

(7) In the terminal group exposure step, the first resin substrate layer 10a is cut along the edge of the terminal group 12t exposed on at least the surface of the substrate bonded body 150a. Therefore, twisted end portions of the first resin substrate layer 10a and the first base coat layer 11a are removed, and the appearance of the organic EL display device 100a can be improved.

(8) In the element original substrate manufacturing step, the organic EL element layer 18 is formed as a thin film element layer, and in the substrate bonding step, the adhesive material layer 45a is formed. Therefore, a self-luminous display device can be achieved.

Second Embodiment

Figure 22:
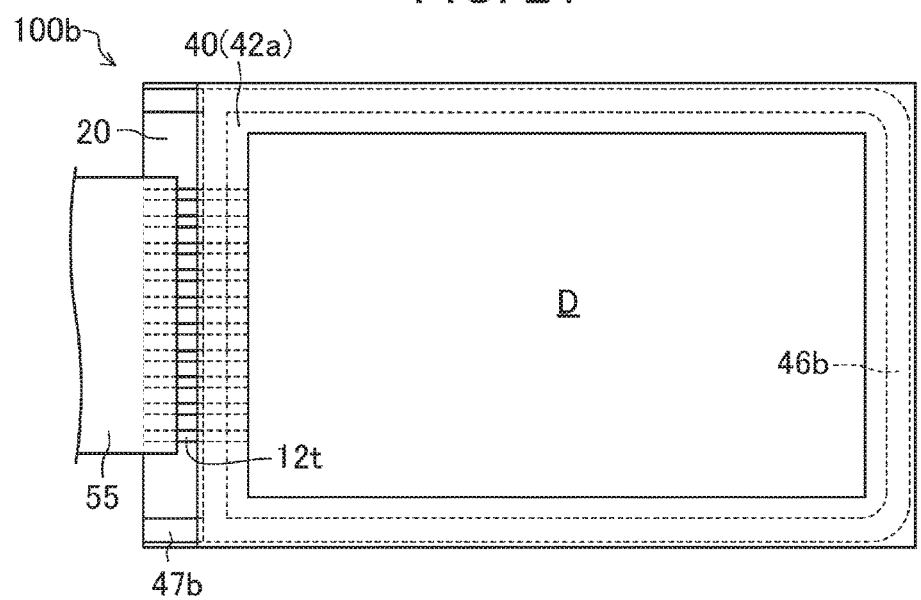
FIG. 22 is a plane view illustrating a schematic configuration of an organic EL display device according to a second embodiment of the present invention.
Figure 23:
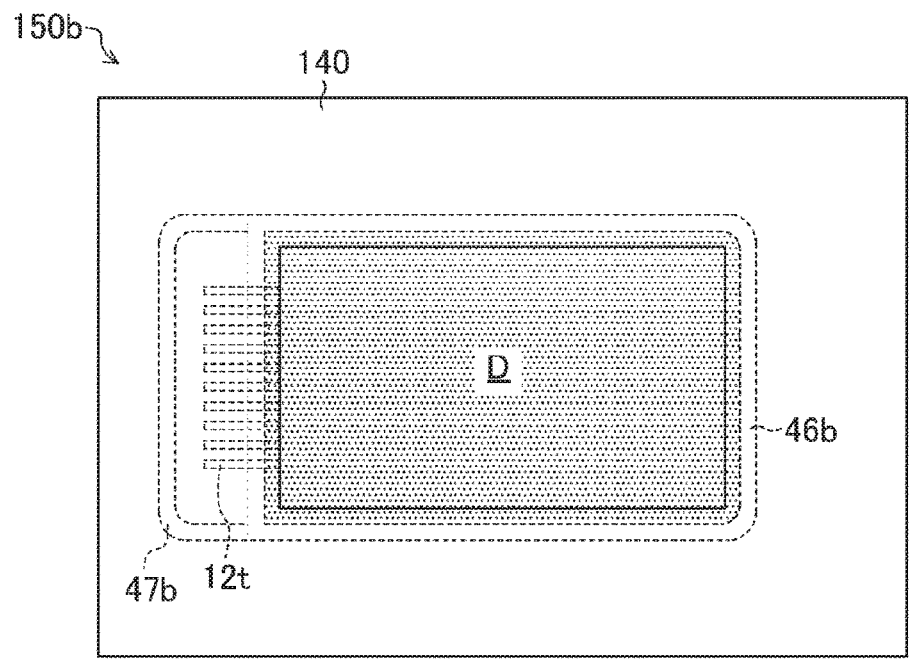
FIG. 23 is a first plane view illustrating a method for manufacturing the organic EL display device according to the second embodiment of the present invention.
Figure 24:
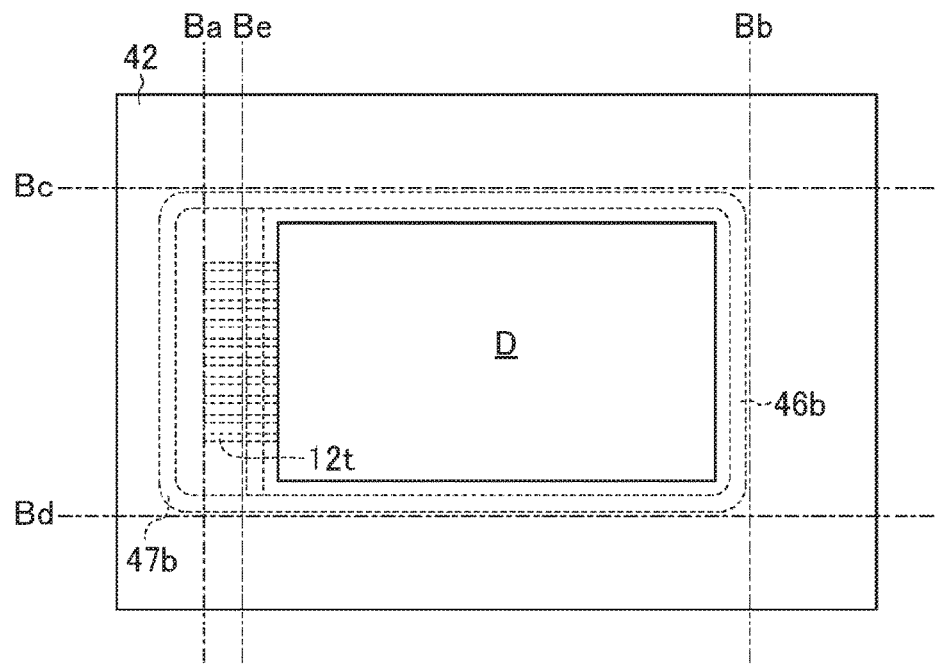
FIG. 24 is a second plane view illustrating the method for manufacturing the organic EL display device according to the second embodiment of the present invention.

FIGS. 22 to 24 illustrate a second embodiment of the display device according to the present invention. FIG. 22 is a plane view illustrating a schematic configuration of an organic EL display device 100b according to this embodiment. FIGS. 23 and 24 are first and second plane views illustrating a method for manufacturing the organic EL display device 100b. In the following embodiments, the same parts as in FIGS. 1 to 21 are denoted by the same reference numerals and will not be further described.

In the first embodiment, the method for manufacturing the organic EL display device 100a in which the element portion sealing member 46a and the terminal portion sealing member 47b are separately formed is exemplified. In this embodiment, the method for manufacturing the organic EL display device 100b in which one side of an element portion sealing member 46b and one side of a terminal portion sealing member 47b are integrally formed will be described.

As illustrated in FIG. 22, the organic EL display device 100b includes the element substrate 20 and the counter substrate 40 that are provided facing each other, the adhesive material layer 45a and the element portion sealing member 46b that are provided between the element substrate 20 and the counter substrate 40, and the FPC 55 mounted on the element substrate 20. Further, the organic EL display device 100b includes the first support film layer 22a bonded to the element substrate 20 through the adhesive layer 21a and the second support film layer 42a bonded to the counter substrate 40 through the adhesive layer 41a. A part of the terminal portion sealing member 47b is left on the element substrate 20 as illustrated in FIG. 22.

The organic EL display device 100b having the above-described configuration has flexibility. When in each sub pixel, light is appropriately emitted by the light emitting layer 3 of each of the organic EL layers 16 via each of the TFTs 12a, the organic EL display device 100b can display an image.

The organic EL display device 100b of the embodiment can be manufactured by changing a part of manufacturing processes in the method described in the first embodiment.

Specifically, in the substrate bonding step, a sealing resin forming the element portion sealing member 46b is disposed in a frame shape surrounding the display region D on a surface of the element original substrate 120 closer to the sealing film 19 by a dispenser method, a screen printing method, or the like, and a sealing resin forming the terminal portion sealing member 47b is disposed in a U shape surrounding the terminal group 12t, as illustrated in FIG. 23.

In the terminal group exposure step, a layered body of the first support film 22, the adhesive layer 21, the first resin substrate layer 10a, and the first base coat layer 11a, and a layered body of the second support film 42, the adhesive layer 41, the second resin substrate layer 30a, and the second base coat layer 31a of a body to be treated in which the second support film 42 is bonded (a substrate bonded body 150b) are cut along cutting lines Ba, Bb, Bc, and Bd by a $CO_2$ laser, a cutter, or the like. Thus, the element substrate 20 is manufactured as illustrated in FIG. 24. The layered body of the second support film 42, the adhesive layer 41, the second resin substrate layer 30a, and the second base coat layer 31a that is cut along the cutting lines Ba, Bb, Bc, and Bd is cut along a cutting line Be by a $CO_2$ laser, a cutter, or the like. Thus, the counter substrate 40 is manufactured and the terminal group 12t on the element substrate 20 is exposed on a surface as illustrated in FIG. 24.

According to the method for manufacturing the organic EL display device 100b of the embodiment as described above, the following effect (9) can be obtained in addition to the effects (1), (2), and (4) to (8).

(1) In the substrate bonding step of bonding the element original substrate 120 and the counter original substrate 140, the terminal portion sealing member 47b is formed in a frame shape surrounding the terminal group 12t between the element original substrate 120 and the counter original substrate 140. For this reason, even when the end portions of the first resin substrate layer 10a and the first base coat layer 11a become twisted due to a difference between the stress applied to the first resin substrate layer 10a and the stress applied to the first base coat layer 11a by peeling the first support substrate 8a and the first separation layer 9a from the substrate bonded body 150b in the subsequent first peeling step, a position of the twist is outside the terminal portion sealing member 47b and apart from the terminal group 12t. Therefore, different intervals between the terminals in the terminal group 12tdue to the twist of the end portions of the first resin substrate layer 10a and the first base coat layer 11a are reduced. Accordingly, in the subsequent mounting step, the FPC 55 is surely mounted on the terminal group 12t, and a mounting failure in the terminal group 12t provided on the first resin substrate layer 10a can be suppressed.

(2) In the substrate bonding step, the element portion sealing member 46b is formed in a frame shape surrounding the adhesive material layer 45a between the element original substrate 120 and the counter original substrate 140. Therefore, excessive spread of the adhesive material layer 45a can be suppressed.

(4) In the first peeling step, the substrate bonded body 150b is irradiated with a laser beam L from the side of the first support substrate 8a that is transparent, and in the second peeling step, the substrate bonded body 150b is irradiated with a laser beam L from the side of the second support substrate 8b that is transparent. Thus, the first support substrate 8a and the second support substrate 8b are mostly kept apart from the substrate bonded body 150b. Therefore, the first support substrate 8a and the second support substrate 8b can be easily peeled from the substrate bonded body 150b.

(7) In the terminal group exposure step, the first resin substrate layer 10a is cut along the edge of the terminal group 12t exposed on at least the surface of the substrate bonded body 150b. Therefore, twisted end portions of the first resin substrate layer 10a and the first base coat layer 11a are removed, and the appearance of the organic EL display device 100b can be improved.

(9) In the substrate bonding step, one side of the element portion sealing member 46b and one side of the terminal portion sealing member 47b are integrally formed. Therefore, the amounts of the sealing resins forming the element portion sealing member 46b and the terminal portion sealing member 47b for drawing can be reduced, which reduces the cost.

Third Embodiment

Figure 25:
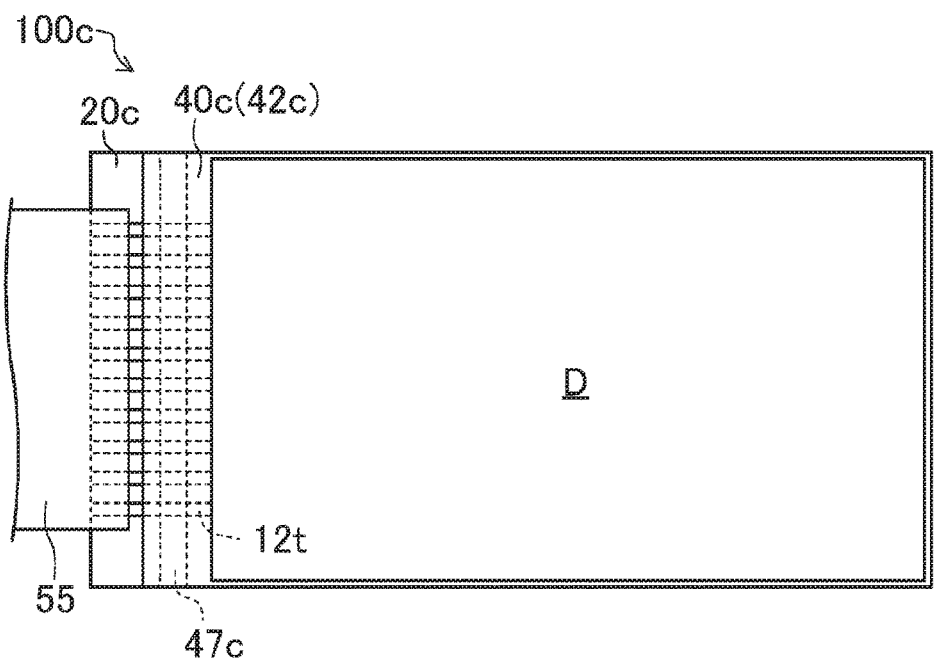
FIG. 25 is a plane view illustrating a schematic configuration of an organic EL display device according to a third embodiment of the present invention.
Figure 26:
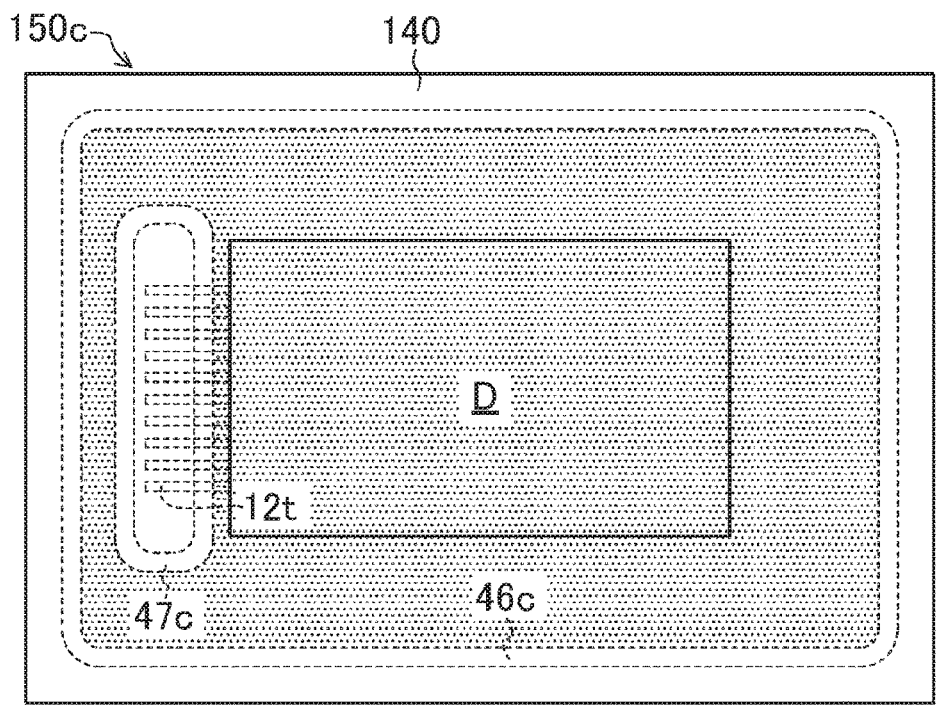
FIG. 26 is a first plane view illustrating a method for manufacturing the organic EL display device according to the third embodiment of the present invention.
Figure 27:
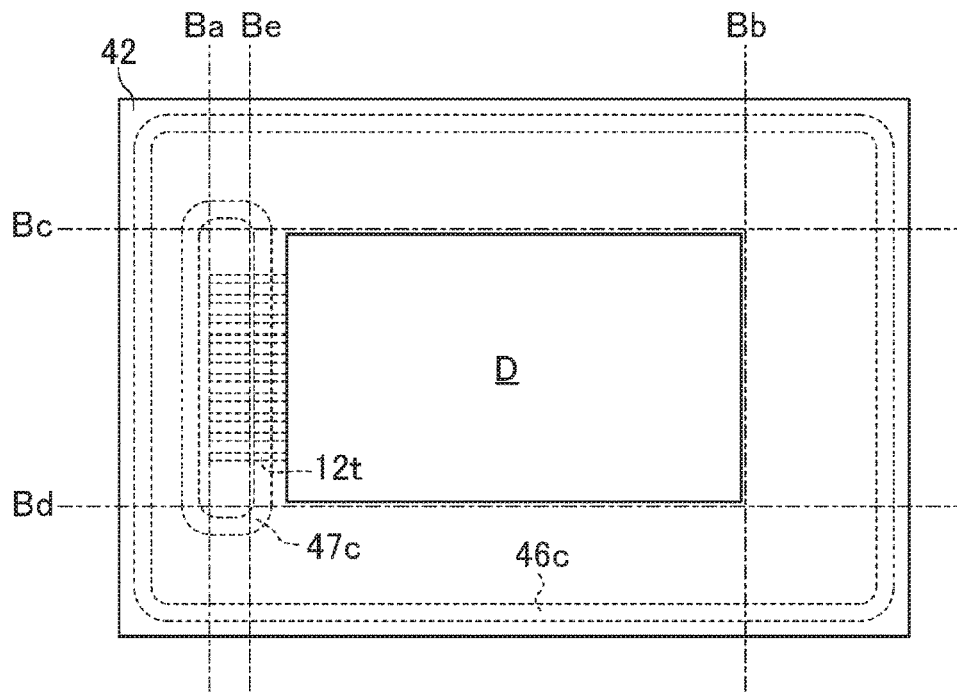
FIG. 27 is a second plane view illustrating the method for manufacturing the organic EL display device according to the third embodiment of the present invention.
Figure 28:
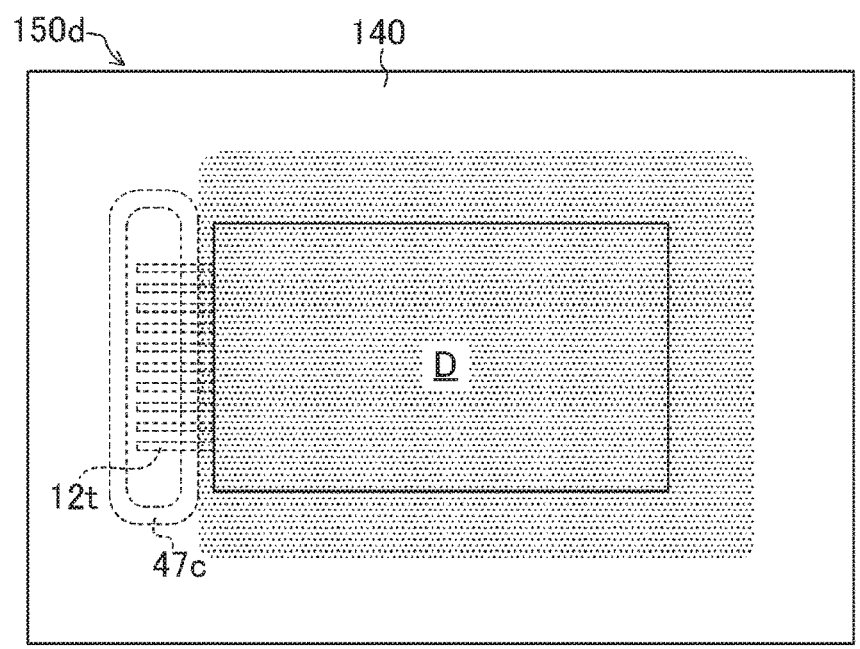
FIG. 28 is a first plane view illustrating a modification of the method for manufacturing the organic EL display device according to the third embodiment of the present invention.
Figure 29:
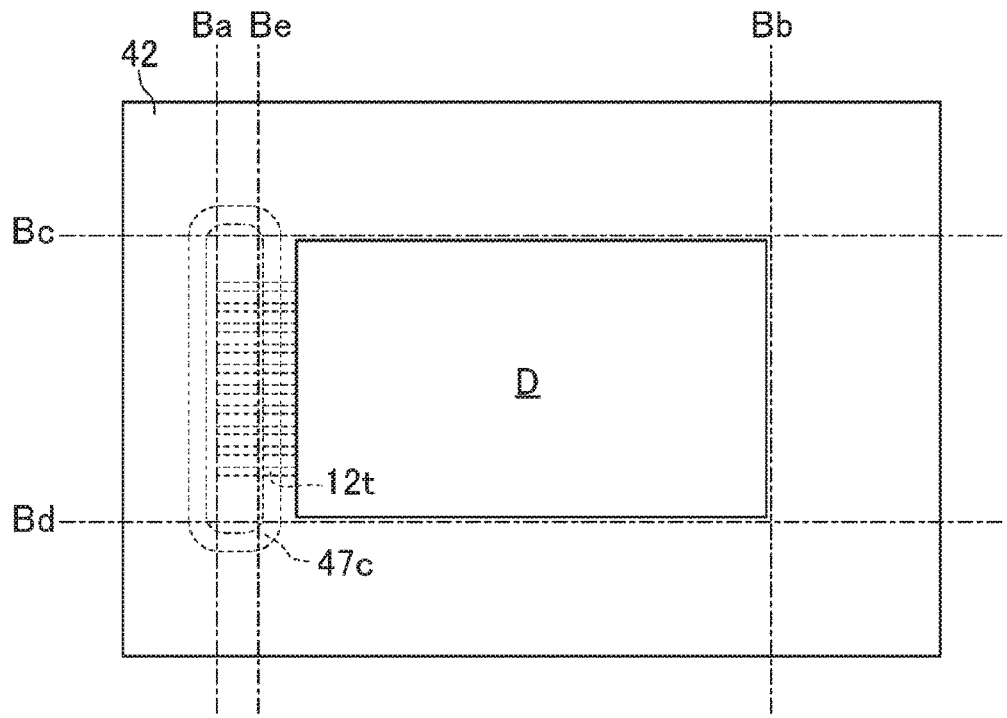
FIG. 29 is a second plane view illustrating the modification of the method for manufacturing the organic EL display device according to the third embodiment of the present invention.

FIGS. 25 to 29 illustrate a third embodiment of the display device according to the present invention. FIG. 25 is a plane view illustrating a schematic configuration of an organic EL display device 100c according to this embodiment. FIGS. 26 and 27 are first and second plane views illustrating a method for manufacturing the organic EL display device 100c. FIGS. 28 and 29 are first and second plane views illustrating a modification of the method for manufacturing the organic EL display device 100c.

In the first and second embodiments, the organic EL display devices 100a and 100b in which the element portion sealing members 46a and 46b, respectively, are provided are exemplified. However, in this embodiment, the organic EL display device 100c in which an element portion sealing member is removed or omitted is exemplified.

As illustrated in FIG. 25, the organic EL display device 100c includes an element substrate 20c and a counter substrate 40c that are provided so as to face each other, the adhesive material layer 45a and a part of a terminal portion sealing member 47c that are provided between the element substrate 20c and the counter substrate 40c, and the FPC 55 mounted on the element substrate 20c. Further, the organic EL display device 100c includes the first support film layer 22a bonded to the element substrate 20c through the adhesive layer 21a and the second support film layer 42a bonded to the counter substrate 40c through the adhesive layer 41a.

Since a layered body of the first support film 22, the adhesive layer 21, the first resin substrate layer 10a, and the first base coat layer 11a of a substrate bonded body 150c or 150d described below is cut at a different position, the external dimension of the element substrate 20c is smaller than that of the element substrate 20 described in the first embodiment. However, the element substrate 20c has substantially the same configuration as that of the element substrate 20 except for the external dimension.

Since a layered body of the second support film 42, the adhesive layer 41, the second resin substrate layer 30a, and the second base coat layer 31a of the substrate bonded body 150c or 150d described below is cut at a different position, the external dimension of the counter substrate 40c is smaller than that of the counter substrate 40 described in the first embodiment. However, the counter substrate 40c has substantially the same configuration as that of the counter substrate 40 except for the external dimension.

The organic EL display device 100c having the above-described configuration has flexibility. When in each sub pixel, light is appropriately emitted by the light emitting layer 3 of each of the organic EL layers 16 via each of the TFTs 12a, the organic EL display device 100c can display an image.

The organic EL display device 100c of the embodiment can be manufactured by changing a part of manufacturing processes in the method described in the first embodiment.

Specifically, in the substrate bonding step, a sealing resin forming an element portion sealing member 46c is disposed in a frame shape on the surface of the element original substrate 120 closer to the sealing film 19 along a peripheral end position of the substrate by a dispenser method, a screen printing method, or the like, and a sealing resin forming a terminal portion sealing member 47c is disposed in a frame shape surrounding the terminal group 12t, as illustrated in FIG. 26.

In the terminal group exposure step, the layered body of the first support film 22, the adhesive layer 21, the first resin substrate layer 10a, and the first base coat layer 11a, and the layered body of the second support film 42, the adhesive layer 41, the second resin substrate layer 30a, and the second base coat layer 31a of the body to be treated in which the second support film 42 is bonded (the substrate bonded body 150c) are cut along cutting lines Ba, Bb, Bc, and Bd by a $CO_2$ laser, a cutter, or the like. Thus, the element substrate 20c is manufactured as illustrated in FIG. 27. The layered body of the second support film 42, the adhesive layer 41, the second resin substrate layer 30a, and the second base coat layer 31a that is cut along the cutting lines Ba, Bb, Bc, and Bd is cut along a cutting line Be by a $CO_2$ laser, a cutter, or the like. Thus, the counter substrate 40c is manufactured and the terminal group 12t on the element substrate 20c is exposed on a surface as illustrated in FIG. 27.

Alternatively, in the substrate bonding step, the sealing resin forming the terminal portion sealing member 47c is disposed in a frame shape surrounding the terminal group 12t on the surface of the element original substrate 120 closer to the sealing film 19 by a dispenser method, a screen printing method, or the like, as illustrated in FIG. 28. The adhesive resin forming the adhesive material layer 45a (a dot portion in FIG. 28) is disposed so as to spread over the whole of display region D because the element portion sealing member 46c (see FIG. 26) is omitted.

In the terminal group exposure step, the layered body of the first support film 22, the adhesive layer 21, the first resin substrate layer 10a, and the first base coat layer 11a, and the layered body of the second support film 42, the adhesive layer 41, the second resin substrate layer 30a, and the second base coat layer 31a of the body to be treated in which the second support film 42 is bonded (the substrate bonded body 150d) are cut along cutting lines Ba, Bb, Bc, and Bd by a $CO_2$ laser, a cutter, or the like. Thus, the element substrate 20c is manufactured as illustrated in FIG. 29. The layered body of the second support film 42, the adhesive layer 41, the second resin substrate layer 30a, and the second base coat layer 31a that is cut along the cutting lines Ba, Bb, Bc, and Bd is cut along a cutting line Be by a $CO_2$ laser, a cutter, or the like. Thus, the counter substrate 40c is manufactured and the terminal group 12t on the element substrate 20c is exposed on a surface as illustrated in FIG. 29.

According to the method for manufacturing the organic EL display device 100c of the embodiment as described above, the following effect (10) can be obtained in addition to the effects (1), (2), and (4) to (8).

(1) In the substrate bonding step of bonding the element original substrate 120 and the counter original substrate 140, the terminal portion sealing member 47c is formed in a frame shape surrounding the terminal group 12t between the element original substrate 120 and the counter original substrate 140. For this reason, even when the end portions of the first resin substrate layer 10a and the first base coat layer 11a become twisted due to a difference between the stress applied to the first resin substrate layer 10a and the stress applied to the first base coat layer 11a by peeling the first support substrate 8a and the first separation layer 9a from the substrate bonded body 150c (150d) in the subsequent first peeling step, a position of the twist is outside the terminal portion sealing member 47c and apart from the terminal group 12t. Therefore, different intervals between the terminals in the terminal group 12t due to the twist of the end portions of the first resin substrate layer 10a and the first base coat layer 11a are reduced. Accordingly, in the subsequent mounting step, the FPC 55 is surely mounted on the terminal group 12t, and a mounting failure in the terminal group 12t provided on the first resin substrate layer 10a can be suppressed.

(2) In the substrate bonding step, the element portion sealing member 46c is formed in a frame shape surrounding the adhesive material layer 45a between the element original substrate 120 and the counter original substrate 140. In this case, excessive spread of the adhesive material layer 45a can be suppressed by the element portion sealing member 46c.

(4) In the first peeling step, the substrate bonded body 150c (150d) is irradiated with a laser beam L from the side of the first support substrate 8a that is transparent, and in the second peeling step, the substrate bonded body 150c (150d) is irradiated with a laser beam L from the side of the second support substrate 8b that is transparent. Thus, the first support substrate 8a and the second support substrate 8b are mostly kept apart from the substrate bonded body 150c (150d). Therefore, the first support substrate 8a and the second support substrate 8b can be easily peeled from the substrate bonded body 150c (150d).

(7) In the terminal group exposure step, the first resin substrate layer 10a is cut along the edge of the terminal group 12t exposed on at least the surface of the substrate bonded body 150c (150d). Therefore, twisted end portions of the first resin substrate layer 10a and the first base coat layer 11a are removed, and the appearance of the organic EL display device 100c can be improved.

(10) Even when the element portion sealing member 46c is formed in a shape surrounding the terminal portion sealing member 47c in the substrate bonding step, the element portion sealing member 46c is removed in the terminal group exposure step or formation of an element portion sealing member that surrounds the display region D is omitted. Therefore, the width of a frame region surrounding the display region D can be decreased, and the organic EL display device 100c can be miniaturized.

Fourth Embodiment

Figure 30:
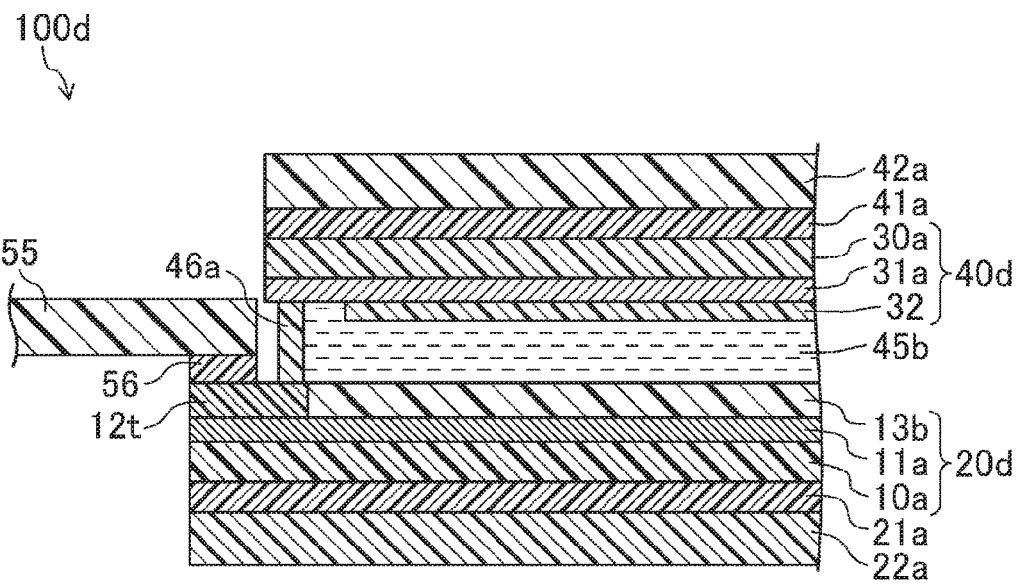
FIG. 30 is a cross-sectional view illustrating a schematic configuration of a liquid crystal display device according to a fourth embodiment of the present invention.

FIG. 30 illustrates a fourth embodiment of the display device according to the present invention. FIG. 30 is cross-sectional view illustrating a schematic configuration of a liquid crystal display device 100d according to this embodiment.

In the first, second, and third embodiments, the organic EL display devices 100a, 100b, and 100c are exemplified as a display device. However, in this embodiment, the liquid crystal display device 100d is exemplified as a display device.

As illustrated in FIG. 30, the liquid crystal display device 100d includes an element substrate 20d and a counter substrate 40d that are provided so as to face each other, a liquid crystal layer 45b and the element portion sealing member 46a that are provided between the element substrate 20d and the counter substrate 40d, and the FPC 55 mounted on the element substrate 20d as a mounting member. As illustrated in FIG. 30, the liquid crystal display device 100d further includes the first support film layer 22a bonded to the element substrate 20d through the adhesive layer 21a and the second support film layer 42a bonded to the counter substrate 40d through the adhesive layer 41a. In the liquid crystal display device 100d, the display region D where an image is displayed is formed in a rectangular shape because a TFT array element layer 13b is provided in a rectangular shape as viewed in a plane view.

As illustrated in FIG. 30, the element substrate 20d includes the first resin substrate layer 10a, the first base coat layer 11a provided on the first resin substrate layer 10a, the TFT array element layer 13b provided on the first base coat layer 11a, and an alignment film (not illustrated) provided covering the TFT array element layer 13b. In a frame region surrounding the display region D, the terminal group 12t for inputting an electrical signal from the FPC 55 into the TFT array element layer 13b is provided on the first base coat layer 11a, as illustrated in FIG. 30. The alignment film on the element substrate 20d and an alignment film on the counter substrate 40d described below are formed, for example, from a polyimide resin.

The TFT array element layer 13b includes, for example, the plurality of TFTs 12a, the interlayer insulating film 13, and a plurality of pixel electrodes that are provided in this order on the first base coat layer 11a. Herein, the pixel electrodes are provided in a matrix on the interlayer insulating film 13 and correspond to each sub pixel. Each of the pixel electrodes are connected to a drain electrode of each of the TFTs 12a via a contact hole formed in the interlayer insulating film 13. The pixel electrodes are each formed form a transparent conductive film of indium tin oxide (ITO) or the like.

As illustrated in FIG. 30, the counter substrate 40d includes the second resin substrate layer 30a, the second base coat layer 31a provided on the second resin substrate layer 30a, the color filter layer 32 provided on the second base coat layer 31a, a common electrode (not illustrated) provided on the color filter layer 32, and an alignment film (not illustrated) provided covering the common electrode. The common electrode is formed, for example, from a transparent conductive film of ITO or the like.

The liquid crystal layer 45b is provided as an intermediate layer between the element substrate 20d and the counter substrate 40d. For example, the liquid crystal layer 45d is formed from a nematic liquid crystal material having an electrooptical properties, or the like.

The liquid crystal display device 100d has flexibility. In each subpixel, a predetermined voltage is applied to the liquid crystal layer 45b between each of the pixel electrodes disposed on the element substrate 20d and the common electrode disposed on the counter substrate 40d via the TFTs 12a to change the alignment state of the liquid crystal layer 45b. This allows the transmittance of light from a backlight to be adjusted to display an image.

The liquid crystal display device 100d of the embodiment can be manufactured by changing a part of manufacturing processes in the method described in the first embodiment.

Specifically, in the element original substrate manufacturing step, the TFTs 12a, the interlayer insulating film 13, the pixel electrodes, and the alignment film are formed on a surface of the first base coat layer 11a by a known method. In the counter original substrate manufacturing step, the color filter layer 32, the common electrode, and the alignment film are formed on a surface of the second base coat layer 31a by a known method.

In the substrate bonding step, on a surface of the alignment film disposed on the element original substrate manufactured in the element original substrate manufacturing step, the sealing resin forming the element portion sealing member 46a is disposed in a frame shape surrounding the display region D, and the sealing resin forming the terminal portion sealing member 47a is disposed in a frame shape surrounding the terminal group 12t by a dispenser method, a screen printing method, or the like. Subsequently, a liquid crystal material is disposed on the surface of the alignment film disposed on the element original substrate and inside the sealing resin forming the element portion sealing member 46a, for example, by a dispenser method. The element original substrate in which the sealing resin and the liquid crystal material are disposed and the counter original substrate manufactured in the counter original substrate manufacturing step are bonded under a reduced pressure atmosphere so that the alignment film of the element original substrate faces the alignment film of the counter original substrate. After then, the reduced pressure atmosphere is released, to pressurize outer surfaces of the element original substrate and the counter original substrate. The sealing resin that is disposed between the element original substrate and the counter original substrate is finally subjected to a heating treatment, and cured. Thus, the element portion sealing member 46a, the terminal portion sealing member 47a, and the liquid crystal layer 45b are formed.

According to the liquid crystal display device 100d of the embodiment as described above, the following effect (11) can be obtained in addition to the effects (1) and (4) to (7).

(11) In the element original substrate manufacturing step, the TFT array element layer 13b is formed as a thin film element layer, and in the substrate bonding step, the liquid crystal layer 45b is formed. Therefore, a light-receiving display device can be achieved.

In this embodiment, a method for manufacturing the liquid crystal display device 100d in which the element portion sealing member 46a and the terminal portion sealing member 47a are separately formed is exemplified like the first embodiment. However, a method for manufacturing a liquid crystal display device in which one side of an element portion sealing member and one side of a terminal portion sealing member are integrally formed may be adopted like the second embodiment.

Other Embodiments

In the first to third embodiments, a top-emitting type organic EL display device is exemplified. However, the present invention may be applied to a bottom-emitting type organic EL display device and the like.

In the first to third embodiments, an organic EL display device in which a color filter layer is provided on a counter substrate and white light is emitted in an element substrate is exemplified. However, the present invention may be also applied to an organic EL display device in which the color filter layer of the counter substrate is omitted and a light emitting layer of the element substrate is formed by a RGB selective application method.

In the above-described embodiments, a method for manufacturing a display device in which a resin substrate layer is peeled from a support substrate by irradiation with a laser beam is exemplified. However, the present invention may be also applied to a method for manufacturing a display device in which an oxide layer is provided between the support substrate and the resin substrate layer, and is subjected to a heating treatment, resulting in crystallization, and the resin substrate layer is peeled from the support substrate.

In the first to third embodiments, an organic EL layer having a layered structure of five layers including a hole injecting layer, a hole transport layer, a light emitting layer, an electron transport layer, and an electron injecting layer is exemplified. However, the organic EL layer may have a layered structure of three layers including a hole injection-cum-transport layer, the light emitting layer, and an electron transport-cum-injecting layer, for example.

In the first to third embodiments, the organic EL display device in which a first electrode is a positive electrode and a second electrode is a negative electrode is exemplified. However, the present invention may be also applied to an organic EL display device in which a layered structure of the organic EL layer is inverted, the first electrode is a negative electrode, and the second electrode is a positive electrode.

In the above-described embodiments, an organic EL display device or liquid crystal display device that includes an element substrate having an electrode of a TFT connected to the first electrode as a drain electrode is exemplified. However, the present invention may be also applied to an organic EL display device or liquid crystal display device that includes an element substrate in which the electrode of the TFT connected to the first electrode is referred to as a source electrode.

INDUSTRIAL APPLICABILITY

As described above, the present invention is useful for a flexible display device.

REFERENCE SIGNS LIST

8a First support substrate
8b Second support substrate
9a First separation layer
9b Second separation layer
10a First resin substrate layer
11a First base coat layer
18 Organic EL element layer (thin film element layer)

20, 20c Element substrate
22 First support film
30a Second resin substrate layer
31a Second base coat layer
40, 40c Counter substrate
42 Second support film
45a Adhesive material layer, sealing resin layer (intermediate layer)
45b Liquid crystal layer (intermediate layer)
46a, 46b Element portion sealing member
47a to 47c Terminal portion sealing member
55 FPC (mounting member)
100a to 100c Organic EL display device
100d Liquid crystal display device
120 Element original substrate
140 Counter original substrate
150a to 150d Substrate bonded body

The invention claimed is:

1. A method for manufacturing a display device comprising:
   an element original substrate manufacturing step of forming a first resin substrate layer on a first support substrate and then forming a thin film element layer and a terminal group connected to the thin film element layer on the first resin substrate layer to manufacture an element original substrate, the element original substrate forming an element substrate;
   a counter original substrate manufacturing step of forming a second resin substrate layer on a second support substrate to manufacture a counter original substrate, the counter original substrate forming a counter substrate;
   a substrate bonding step of bonding the element original substrate to the counter original substrate through an intermediate layer so that the thin film element layer and the terminal group face the second resin substrate layer, to manufacture a substrate bonded body;
   a first peeling step of peeling the first support substrate from the substrate bonded body;
   a first film bonding step of bonding a first support film to the first resin substrate layer of the substrate bonded body obtained by peeling the first support substrate;
   a second peeling step of peeling the second support substrate from the substrate bonded body obtained by bonding the first support film;
   a second film bonding step of bonding a second support film to the second resin substrate layer of the substrate bonded body obtained by peeling the second support substrate;
   a terminal group exposure step of exposing the terminal group on a surface; and
   a mounting step of mounting a mounting member on the terminal group exposed on the surface of the substrate bonded body,
   wherein in the substrate bonding step, a terminal portion sealing member is formed in a frame shape surrounding the terminal group between the element original substrate and the counter original substrate, and
   wherein the terminal group exposure step further includes,
   a first cutting step of cutting the first support film, the first resin substrate layer, the second resin substrate layer, and the second support film along an edge each of four sides surrounding a display region of the display device and the terminal group, and
   a second cutting step of cutting the second resin substrate layer and the second support film along a side between the terminal group and the display region, to expose the terminal group on a surface,
   wherein in the first cutting step, at least one side among four sides of the terminal portion sealing member is cut.

2. The method for manufacturing a display device according to claim 1,
   wherein in the substrate bonding step, an element portion sealing member is formed in a frame shape surrounding the intermediate layer between the element original substrate and the counter original substrate.

3. The method for manufacturing a display device according to claim 2,
   wherein in the substrate bonding step, the terminal portion sealing member is formed in a shape surrounding the element portion sealing member.

4. The method for manufacturing a display device according to claim 2,
   wherein in the substrate bonding step, one side of the element portion sealing member and one side of the terminal portion sealing member are integrally formed.

5. The method for manufacturing a display device according to claim 2,
   wherein in the substrate bonding step, the element portion sealing member is formed in a shape surrounding the terminal portion sealing member.

6. The method for manufacturing a display device according to claim 1,
   wherein in the first peeling step, the substrate bonded body is irradiated with a laser beam from a side of the first support substrate being transparent, and
   in the second peeling step, the substrate bonded body is irradiated with a laser beam from a side of the second support substrate being transparent.

7. The method for manufacturing a display device according to claim 6,
   wherein in the element original substrate manufacturing step, a first separation layer is formed between the first support substrate and the first resin substrate layer, and
   in the counter original substrate manufacturing step, a second separation layer is formed between the second support substrate and the second resin substrate layer.

8. The method for manufacturing a display device according to claim 6,
   wherein in the element original substrate manufacturing step, a first base coat layer is formed between the first resin substrate layer and the thin film element layer and the terminal group, and
   in the counter original substrate manufacturing step, a second base coat layer is formed on the second resin substrate layer.

9. The method for manufacturing a display device according to claim 1,
   wherein in the terminal group exposure step, the first resin substrate layer is cut along at least an edge of the terminal group exposed on the surface of the substrate bonded body.

10. The method for manufacturing a display device according to claim 1,
    wherein the thin film element layer is an organic EL element layer, and
    the intermediate layer is an adhesive material layer or a sealing resin layer.

11. The method for manufacturing a display device according to claim 1,
    wherein the thin film element layer is a TFT array element layer, and
    the intermediate layer is a liquid crystal layer.

12. The method for manufacturing a display device according to claim 1,
- wherein a side of the four sides of the terminal portion sealing member is disposed between the terminal group and the display region, and
- in the first cutting step, a side facing the side of the four sides is cut.

13. The method for manufacturing a display device according to claim 1,
- wherein a side of the four sides of the terminal portion sealing member is disposed between the terminal group and the display region, and
- in the first cutting step, the side of the four sides is not cut and the other three sides of the four sides are cut.

\* \* \* \* \*